United States Patent
Kobayashi et al.

(10) Patent No.: US 8,947,665 B2
(45) Date of Patent: *Feb. 3, 2015

(54) MEASUREMENT METHOD, MEASUREMENT APPARATUS, EXPOSURE METHOD, AND EXPOSURE APPARATUS

(75) Inventors: Mitsuru Kobayashi, Sagamihara (JP); Masahiko Yasuda, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/495,284

(22) Filed: Jun. 13, 2012

(65) Prior Publication Data
US 2013/0027680 A1 Jan. 31, 2013

Related U.S. Application Data

(62) Division of application No. 11/587,099, filed as application No. PCT/JP2005/007507 on Apr. 20, 2005.

(30) Foreign Application Priority Data

Apr. 23, 2004 (JP) ................................ P2004-128536

(51) Int. Cl.
*G01B 11/00* (2006.01)
*G03F 9/00* (2006.01)

(52) U.S. Cl.
CPC ............ *G03F 9/7046* (2013.01); *G03F 9/7003* (2013.01); *G03F 9/7011* (2013.01); *G03F 9/7019* (2013.01)
USPC ............................ 356/401; 356/399; 356/400

(58) Field of Classification Search
USPC .................................................. 356/399–401
See application file for complete search history.

(56) References Cited

U.S. PATENT DOCUMENTS 4,702,606 A * 10/1987 Matsuura et al. ............. 356/401
5,493,403 A    2/1996 Nishi (Continued)

FOREIGN PATENT DOCUMENTS

EP    1043761 A1    10/2000
EP    1207426 A1     5/2002

(Continued)

OTHER PUBLICATIONS

English language International Search Report form PCT/ISA/210 (Second Sheet) for PCT/JP2005/007507.

(Continued)

*Primary Examiner* — Tarifur Chowdhury
*Assistant Examiner* — Isiaka Akanbi
(74) *Attorney, Agent, or Firm* — Staas & Halsey LLP

(57) ABSTRACT

To perform high-speed and highly accurate measurement by setting desired measuring conditions for each measuring object. In an alignment sensor of exposure apparatus, in the case of performing position measurement for a plurality of sample shots, measurement is performed by changing the measuring conditions, in response to a measuring axis direction, a mark or a layer whereupon a mark to be measured exists. At that time, for the measuring objects to be measured under the same measuring conditions, for example, a position in a Y axis direction and a position in an X axis direction, measurement is continuously performed. When the measuring condition is changed, a baseline value is remeasured. The changeable measuring conditions are wavelength of measuring light, use and selection of a retarder, NA and σ of an optical system, a light quantity of measuring light, illumination shape, signal processing algorithm, etc.

25 Claims, 11 Drawing Sheets

(56) References Cited

U.S. PATENT DOCUMENTS

| | | | |
|---|---|---|---|
| 5,532,091 | A | 7/1996 | Mizutani |
| 5,706,091 | A | 1/1998 | Shiraishi |
| 5,721,607 | A * | 2/1998 | Ota .................................. 355/53 |
| 5,734,478 | A * | 3/1998 | Magome et al. ............... 356/401 |
| 6,108,089 | A | 8/2000 | Shiraishi ........................ 356/375 |
| 6,335,537 | B1 | 1/2002 | Takahashi ..................... 250/548 |
| 6,411,386 | B1 * | 6/2002 | Nishi ............................. 356/401 |
| 6,416,912 | B1 | 7/2002 | Kobayashi et al. |
| 6,483,571 | B1 | 11/2002 | Shiraishi |
| 6,838,686 | B2 | 1/2005 | Kataoka |
| 6,999,893 | B2 | 2/2006 | Matsumoto et al. |
| 7,098,046 | B2 | 8/2006 | Kataoka |
| 2002/0034831 | A1 | 3/2002 | Kataoka ............................ 438/7 |
| 2003/0020889 | A1 | 1/2003 | Takahashi |
| 2004/0174510 | A1 | 9/2004 | Kataoka |

FOREIGN PATENT DOCUMENTS

| | | | |
|---|---|---|---|
| JP | 4-65603 | | 3/1992 |
| JP | 7-249558 | | 9/1995 |
| JP | 8-306609 | | 11/1996 |
| JP | 2591746 | | 12/1996 |
| JP | 9-134563 | | 5/1997 |
| JP | 9-134863 | | 5/1997 |
| JP | 99/34416 | A1 | 7/1999 |
| JP | 2002-170757 | | 6/2002 |
| JP | 2002-170770 | | 6/2002 |
| JP | 2002-198291 | | 7/2002 |
| JP | 2002-323394 | | 11/2002 |
| JP | A-2000-323394 | | 11/2002 |
| WO | 99/34416 | A1 | 7/1999 |

OTHER PUBLICATIONS

Written Opinion issued Aug. 16, 2005 in corresponding International Patent Application PCT/JP2005/007507.
European Office Action issued Dec. 22, 2009 in corresponding European Patent Application 05 734 605.8.
European Search Report mailed Sep. 30, 2009 in corresponding European Patent Application 05734605.8.
European Office Acton issued Oct. 28, 2011 in corresponchng European Patent Appiication No. 05734605.8.
Notification of Missing Requirements maild Jun. 21, 2007 in U.S. Appl. No. 11/587,099.
Notice of Acceptance of Application mailed Oct. 11, 2007 in U.S. Appl. No. 11/587,099.
Office Action mailed Dec. 5, 2008 in U.S. Appl. No. 11/587,099.
Office Action mailed Sep. 2, 2009 in U.S. Appl. No. 11/587,099.
Office Action mailed Jan. 14, 2010 in U.S. Appl. No. 11/587,099.
Office Action mailed Aug. 5, 2010 in U.S. Appl. No. 11/587,099.
Advisory Action mailed Dec. 22, 2010 in U.S. Appl. No. 11/587,099.
Notice of Panel Decision from Pre-Appeal Brief Review mailed Mar. 1, 2011 in U.S. Appl. No. 11/587,099.
Office Action mailed May 10, 2011 in U.S. Appl. No. 11/587,099.
Office Action mailed Nov. 22, 2011 in U.S. Appl. No. 11/587,099.
U.S. Appl. No. 11/587,099, filed Aug. 1, 2007, Mitsuru Kobayashi, et al., Nikon Corporation.
Notice of Allowance mailed Jun. 21, 2012, in U.S. Appl. No. 11/587,099.
European Office Action mailed Jun. 12, 2012 for corresponding European Patent Application No. 05 734 605.8.
Notice of Allowance Nov. 9, 2012 in corresponding U.S. Appl. No. 11/587,099.

* cited by examiner

US 8,947,665 B2

MEASUREMENT METHOD, MEASUREMENT APPARATUS, EXPOSURE METHOD, AND EXPOSURE APPARATUS

CROSS-REFERENCE TO RELATED APPLICATIONS

This application is a divisional of U.S. Ser. No. 11/587,099, filed Aug. 1, 2007, which is based on PCT Application No. PCT/JP2005/007507 filed Apr. 20, 2005, and Japanese Application No. 2004-128536 filed on Apr. 23, 2004, the disclosures of which are hereby incorporated herein by reference in their entireties.

TECHNICAL FIELD

This invention relates to a measurement method and a measurement apparatus suitable for measurement of the positions of marks formed on mask or substrate in photolithography process when manufacturing semiconductor devices and other electronic device, as well as to an exposure method and exposure apparatus used to measure the positions of marks formed on a mask or a substrate by this measurement method and to perform exposure.

BACKGROUND ART

In the manufacture of semiconductor devices, liquid crystal display devices, CCDs and other image-capture devices, plasma display devices, thin film magnetic heads, and other electronic devices (hereafter severally called "electronic devices"), an exposure apparatus is employed to project image of a fine pattern formed on a photomask or a reticle (hereafter "reticle") onto a semiconductor wafer, a glass plate or similar (hereafter "wafer") onto which a photoresist or other photosensitive material has been applied, to perform exposure. At this time, the reticle and wafer must be positioned (aligned) with high precision, and the pattern of the reticle must be superposed onto the pattern of the wafer with high precision. In recent years, there has been rapid progress toward finer pattern and higher integration density, and so ever-higher exposure precision has come to be demanded from such exposure apparatus. For this reason, ever stricter demands have been imposed on alignment precision as well, and higher alignment precision is sought.

In the conventional art, wafer position measurement has been performed by measuring the position of a positioning mark (alignment mark) formed on the wafer. As the alignment system used to measure the position of these alignment mark, for example, an off-axis alignment sensor of a FIA (Field Image Alignment) system, which irradiates the mark using light of broad wavelength band using a halogen lamp or similar as a light source, capturing the reflected light with a CCD camera or similar, and performing image processing of the image data of alignment mark thus obtained to measure mark position, are well known. By means of the alignment sensor of such the FIA system, thin film interference by the resist layer does not easily influence the result, and the position of an aluminum mark, an asymmetrical mark and similar can also be detected with high precision. Methods have also been disclosed enabling image capture of mark with high contrast by selecting the wavelength of the detection light (see for example Patent Reference 1) and for detecting with high precision the position even of mark with small step height using the light reflected from the mark, by emphasizing change in the detection light (see for example Patent Reference 2); and various methods have been proposed for performing alignment with higher precision.

However, when for example positioning the wafer and shot areas, the positions in the X-axis direction and Y-axis direction of each of a plurality of prescribed marks on the same wafer are measured, and based on the results EGA computations are for example performed to finally obtain the position information for control. That is, in a series of alignment processing (mark measurement processing), it is often the case that a plurality of position measurement processing operations (measurement processes for a plurality of marks) are normally performed. However, in alignment measurement methods of the conventional art, during a series of alignment measurement processing operations for the same wafer, only a single set of measurement conditions, set in advance, is applied to a plurality of objects for measurement (marks) when performing measurement processing. That is, appropriate measurement conditions have not been set for each measurement object to perform position measurements or similar.

More specifically, when for example a plurality of marks are formed in different layers on a wafer, or when the measurement precision (alignment precision) required is different for each measurement axis direction, there may be cases in which the optimum measurement conditions are different for each measurement object (mark). However, in measurement methods of the conventional art, measurements are performed under a single set of measurement conditions when performing a series of measurement processing operations, so that measurements may not have been performed under optimum conditions for each of the measurement objects (marks). If measurement conditions were to be modified for each measurement object, such problems as a considerable worsening of throughput, or adverse effects on the measurement precision accompanying fluctuations in the baseline value, or similar would result, and so measurement under such optimum conditions have in effect not been possible.

Patent Reference 1: Japanese Unexamined Patent Application, First Publication No. 2002-170757

Patent Reference 2: Japanese Unexamined Patent Application, First Publication No. H09-134863

DISCLOSURE OF INVENTION

According to a first aspect of the invention, a measurement method is provided which is a measurement method of using a measurement system to measure a plurality of first marks and a plurality of second marks different from the first marks as measurement objects formed on the prescribed substrate, and comprises a first process of setting a measurement condition for the measurement system as a first condition when measuring the plurality of first marks among the marks which are the measurement objects on the prescribed substrate (S211, S411); a second process, after measuring all of the first marks on the prescribed substrate under the first condition (S212 to S215, S413 to S416), of switching the measurement condition from the first condition and setting a second condition (S221, S421); and, a third process of measuring all of the second marks among the marks which are the measurement objects on the prescribed substrate, under the second condition (S222 to S225, S423 to S426).

According to a second aspect of the invention, a measurement method is provided which is a measurement method of using a measurement system to measure a plurality of first marks and a plurality of second marks different from the first marks as measurement objects formed on the prescribed substrate, and comprises a first process of setting a measurement condition for the measurement system to a first condition when measuring the first marks on the prescribed substrate (S311, S411); a second process of setting the measurement condition for the measurement system to a second condition, different from the first condition, when measuring the second marks on the prescribed substrate (S321, S421); and a third process of measuring, for both the first condition and for the second condition, a baseline value, which is an interval between a reference position for measurements using the measurement system and a reference position which specifies the position when performing processing in a processing system to perform desired processing of the substrate (S312, S322, S412, S422).

According to a third aspect of the invention, a measurement method is provided which is a measurement method of using a measurement system, comprising an illumination optical system which irradiates a plurality of first marks and a plurality of second marks different from the first marks as measurement objects formed on the prescribed substrate, with an illuminating beam and a light-receiving optical system which receives the light beam from the marks, to measure the first and second marks, and wherein, as a measurement condition which can be modified when measuring the marks, the measurement system comprises at least one among a light quantity of the illumination beam, NA or σ of the illumination optical system, an insertion into or retraction from the light-receiving optical system of a phase-imparting member which imparts a prescribed phase difference to the diffraction beam of a prescribed order arising from the marks, and a signal processing condition when processing a photoelectric converted signal obtained upon receiving the beam arising from the marks; and wherein, when measuring the first marks on the prescribed substrate, the measurement condition of the measurement system are set to a first condition (S111), and when measuring the second marks on the prescribed substrate, the measurement condition of the measurement system is a set to second condition different from the first condition (S113).

According to a fourth aspect of the invention, an exposure method is provided which is an exposure method for transferring a pattern formed on a mask onto a substrate, and which comprises a process of using the measurement method according to any one of the above-described first through third aspects to measure the positions of marks formed on the mask or substrate, and based on the measurement results, of performing positioning of the mask or of the substrate.

According to a fifth aspect of the invention, a measurement apparatus is provided which enables measurement of measurement objects on a body by means of the measurement method according to any one of the above-described first through third aspects.

According to a sixth aspect of the invention, a measurement apparatus is provided which is a measurement apparatus to measure a plurality of first marks and a plurality of second marks different from the first marks as measurement objects formed on a prescribed substrate, and which has a condition setting means for setting a measurement condition for the measurement apparatus to a first condition when measuring the plurality of first marks among the marks which are the measurement objects on the prescribed substrate and for setting the measurement condition to a second condition different from the first condition when measuring the plurality of second marks, and a control means for controlling the condition setting means so as to switch the measurement condition from the first condition to set the second condition after measuring all of the first marks on the prescribed substrate under the first condition.

According to a seventh aspect of the invention, a measurement apparatus is provided which is a measurement apparatus to measure a plurality of first marks and a plurality of second marks different from the first marks as measurement objects formed on a prescribed substrate, and which has a condition setting means for setting a measurement condition for the measurement apparatus to a first condition when measuring the plurality of first marks among the marks which are the measurement objects on the prescribed substrate and for setting the measurement condition to a second condition different from the first condition when measuring the plurality of second marks, and a retention apparatus (memory 305) which retains for each of the conditions which are set a baseline value, which is the interval between a reference position for measurements using the measurement apparatus and a reference position which specifies the position when performing processing in a processing apparatus to perform desired processing of the substrate.

According to an eighth aspect of the invention, a measurement apparatus is provided which is a measurement apparatus to measure a plurality of first marks and a plurality of second marks different from the first marks as measurement objects formed on a prescribed substrate, which comprises an illumination optical system to irradiate the marks with an illuminating beam and a light receiving optical system which receives the beam from the marks, and which has condition setting means for setting, as the measurement condition of the measurement apparatus which can be modified when measuring the marks, at least one among the light quantity of the illumination beam, the NA or σ of the illumination optical system, the insertion into or retraction from the light-receiving optical system of a phase-imparting member which imparts a prescribed phase difference to the diffraction beam of a prescribed order arising from the marks, and the signal processing condition when processing photoelectric converted signals obtained upon receiving the beam arising from the marks, to a first condition as measurement condition of the measurement apparatus when measuring the plurality of first marks among the marks which are the measurement objects on the prescribed substrate, and for setting the measurement condition to a second condition different from the first condition when measuring the plurality of second marks.

According to a ninth aspect of the invention, an exposure apparatus is provided which is an exposure apparatus for transferring a pattern formed on a mask onto a substrate, which has a positioning apparatus using, for either the mask or the substrate, the measurement apparatus according to any one among the above-described fifth through eighth aspects to measure the positions of marks formed on the mask or substrate, and which performs positioning of the mask or substrate based on the measurement results.

By means of a measurement method or measurement apparatus of this invention, the optimum measurement condition can be set for each measurement object and measurements performed without causing a reduction in measurement throughput, and consequently measurements can be performed rapidly and with high precision. And, by means of an exposure method or exposure apparatus of this invention, a measurement method or measurement apparatus of this invention is used to position the wafer or reticle, so that exposure processing can be performed rapidly and with high precision.

BEST MODE FOR CARRYING OUT THE INVENTION

Figure 1:
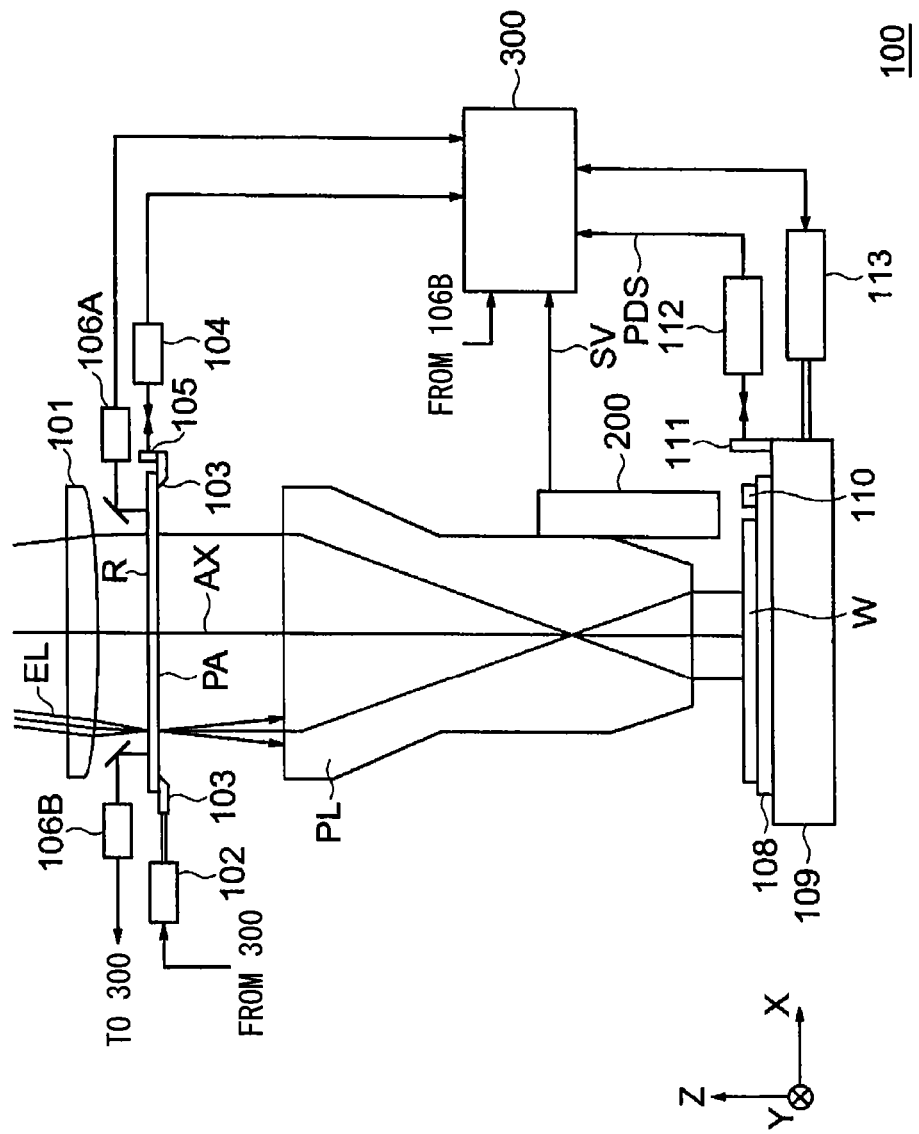
FIG. 1 shows the configuration of the exposure apparatus of an aspect of the invention.

The exposure apparatus of an embodiment of the invention is described referring to FIG. 1 to FIG. 10. FIG. 1 shows in summary the configuration of the exposure apparatus 100 of this embodiment. In the following description, the constituent elements and the positional relations thereof are described based on an XYZ orthogonal coordinate system such as that shown in FIG. 1. In this XYZ orthogonal coordinate system, the X axis and Z axis are set parallel to the plane of the paper, and the Y axis is set perpendicular to the plane of the paper. In actual space, the XY plane is a plane parallel to the horizontal plane, and the Z axis direction is the vertical direction. In the exposure apparatus 100 shown in FIG. 1, the exposure light EL radiated from the illumination optical system, not shown, passes through the condenser lens 101 to irradiate the pattern area PA formed on the reticle R with a uniform illuminance distribution. As the exposure light EL, for example, the g line (wavelength 436 nm), i line (wavelength 365 nm), KrF excimer laser beam (wavelength 248 nm), ArF excimer laser beam (wavelength 193 nm), or $F_2$ laser beam (wavelength 157 nm), or similar is used.

The reticle R is placed on the reticle stage 103. The reticle stage 103 is installed so as to enable fine movement along the direction of the optical axis AX of the projection optical system PL by the motor 102, and moreover can move in two dimensions and can undergo fine rotation in the plane perpendicular to the optical axis AX. A movement mirror 105 which reflects a laser beam from a laser interferometer 104 is fixed to an edge portion of the reticle stage 103, and the two-dimensional position of the reticle stage 103 is continuously detected, with a resolution of for example approximately 0.01 μm, by the laser interferometer 104.

The reticle alignment systems 106A and 106B (hereafter collectively called the "reticle alignment system 106") are positioned above the reticle R. The reticle alignment system 106 detects at least two cross-shaped alignment marks formed in the vicinity of the periphery of the reticle R. Through fine movement of the reticle stage 103 based on measurement signals from the reticle alignment system 106, the reticle R is positioned such that the center point of the pattern area PA coincides with the optical axis AX of the projection optical system PL.

The exposure light EL passing through the pattern area PA of the reticle R passes through for example both sides (or one side) of the telecentric projection optical system PL and is projected onto each shot area on the wafer (substrate) W. The projection optical system PL is corrected optimally for aberration for the wavelength of the exposure light EL, and at this wavelength, the reticle R and wafer W are mutually conjugate. The projection optical system PL has a plurality of optical elements such as lenses; as the lens material of these optical elements, quartz, fluorite, or another optical material is selected according to the wavelength of the exposure light EL.

The wafer W is mounted on the wafer stage 109 via a wafer holder 108. A reference plate 110 is provided on the wafer holder 108. On this reference plate 110 are formed wafer fiducial marks (wafer reference marks) used in baseline measurements and similar. The surface of the reference plate 110 is set so as to be the same height as the surface of the wafer W.

The wafer stage 109 comprises an XY stage which positions the wafer W in two dimensions within the plane perpendicular to the optical axis AX of the projection optical system PL; a Z stage which positions the wafer W in the direction parallel to the optical axis AX of the projection optical system PL (the Z direction); a stage for fine rotation of the wafer W; a stage to adjust the inclination of the wafer W relative to the XY plane by changing the angle with respect to the Z axis; and similar. An L-shape movement mirror 111 is mounted on one end of the upper face of the wafer stage 109, and a laser interferometer 112 is positioned in a position opposing the mirror face of the movement mirror 111. In FIG. 1, the diagram is simplified, but the movement mirror 111 comprises a plane mirror having a reflecting face perpendicular to the X axis and a plane mirror having a reflecting face perpendicular to the Y axis.

The laser interferometer 112 comprises two X-axis laser interferometers which emit laser beams along the X axis to irradiate the movement mirror 111 and a Y-axis laser interferometer which emits a laser beam along the Y axis to irradiate the movement mirror 111; the X coordinate and Y coordinate of the wafer stage 109 are measured by means of one X-axis laser interferometer and one Y-axis laser interferometer. In addition, the rotation angle in the XY plane of the wafer stage 109 is measured using the difference in the measurement values of the two X-axis laser interferometers.

The two-dimensional coordinates of the wafer stage 109 are constantly detected by the laser interferometer 112 with a resolution of for example approximately 0.01 μm, and the stage coordinate system (stationary coordinate system) (x,y) of the wafer stage 109 is determined from the coordinates in the X-axis direction and Y-axis direction. That is, the coordinate values of the wafer stage 109 measured by the laser interferometer 112 are coordinate values in the stage coordinate system (x,y).

Position measurement signals PDS indicating the X coordinate, Y coordinate, and rotation angle measured by the laser interferometer 112 are output to the main control system 300. The main control system 300 generates control signals to control the position of the wafer stage 109 based on the position measurement signals PDS thus supplied, and outputs the generated signals to the motor 113. The main control system 300, by controlling whether or not exposure light is emitted from the light source, not shown, and by controlling the intensity of the exposure light when exposure light is emitted, controls the exposure light passing through the condenser lens 101 and the projection optical system PL.

Figure 2:
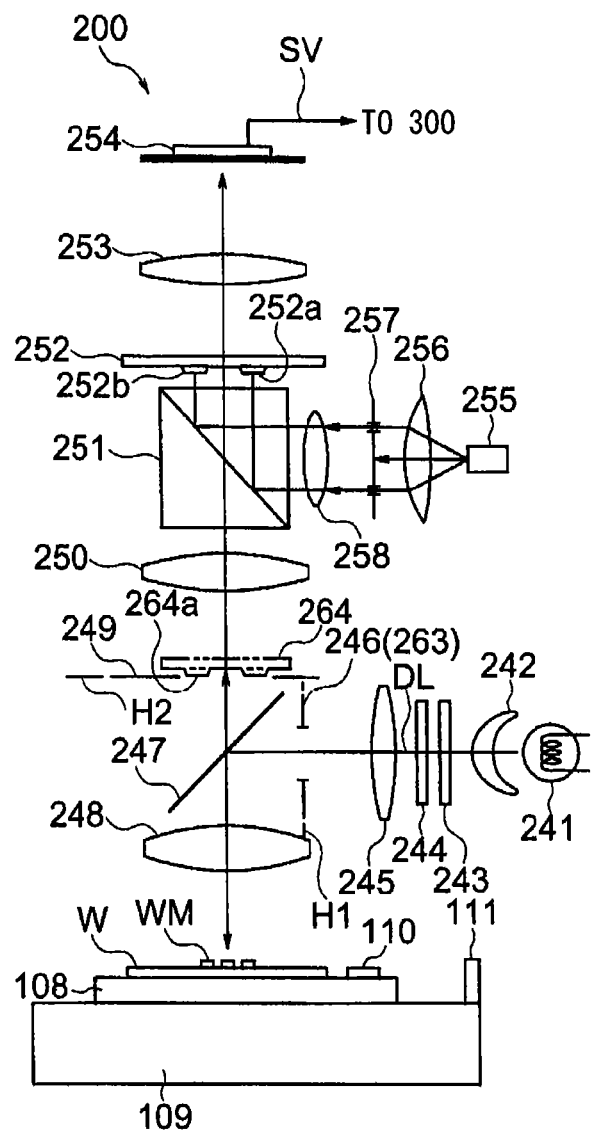
FIG. 2 shows the configuration of an alignment sensor in the exposure apparatus shown in FIG. 1.

The exposure apparatus 100 comprises, on the side of the projection optical system PL, an alignment optical system 200 (hereafter called an alignment sensor 200) employing the off-axis FIA (Field Image Alignment) method (image capture method). The alignment sensor 200 is described in detail referring to FIG. 2. FIG. 2 shows in summary the configuration of the alignment sensor 200.

In the alignment sensor 200, broad-band illumination light (broad-band light) emitted from a halogen lamp or other light source 241 passes through the condenser lens 242 and wavelength selection mechanism 243, and is incident on the illumination field diaphragm 244.

The wavelength selection mechanism 243 is a mechanism which causes a beam in a wavelength region to which photoresist applied to the wafer W is insensitive, and only a beam in a wavelength region suitable for detection of the marks or similar which are the detection objects (alignment objects), to be passed. The wavelength selection mechanism 243 has, for example, a plurality of filters to extract light of mutually different wavelengths, and a filter driving unit that puts one among the plurality of filters on the optical path of the broadband light emitted from the light source 241. In this embodiment, the wavelength selection mechanism 243 comprises four filters, which respectively pass a beam of wavelength 530 to 620 nm (green light), a beam of wavelength 620 to 710 nm (orange light), a beam of wavelength 710 to 800 nm (red light), and a beam of wavelength 530 to 800 nm (white light). It is preferable that the filters used in wavelength selection be positioned at positions which are conjugate with the light source 241, and at which irregular coloring does not readily occur. Filters are not limited to the filter types which pass prescribed wavelength regions as described above, and a plurality of filter types which cut out prescribed wavelength regions may be used in combination to extract and pass only desired wavelengths.

Illumination light DL which has passed the transmission portion of the illumination field diaphragm 244 passes through the relay lens 245 and is incident on the illumination aperture diaphragm 246 (263). Furthermore, the illumination light DL passes through a beam splitter 247 and objective lens 248, and illuminates an area comprising marks WM which are position detection objects of the wafer W or another desired illumination area. The illumination field diaphragm 244 is effectively conjugate (in a focusing relation) with the surface of the wafer W (the wafer marks WM), and the illumination area on the wafer W can be limited according to the shape and size of the transmission portion of the illumination field diaphragm 244.

Figure 3A:
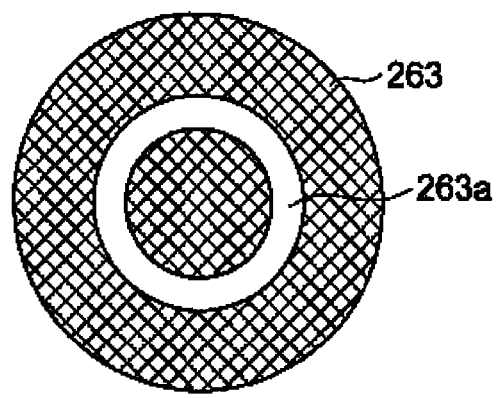
FIG. 3A is a diagram used to explain the illumination aperture diaphragm of the alignment sensor shown in FIG. 2.

The illumination aperture diaphragm 246 (263) is positioned in the plane (called the illumination system pupil plane) which is in an optical Fourier transform relation, via the objective lens 248 and beam splitter 247, with the wafer surface (wafer marks WM). As the illumination aperture diaphragm, a configuration is employed enabling selection of an illumination aperture diaphragm 246 having a normally round transmission portion, and an illumination aperture diaphragm 263 having a ring-shaped transmission portion 263a such as shown in FIG. 3A. When a normal illumination state (so-called normal illumination) of the marks is used to perform alignment (mark) measurement, the illumination aperture diaphragm 246 is positioned on the illumination optical path, and when so-called modified illumination (or ring-shaped illumination as inclined illumination) is used to perform mark measurements, the illumination aperture diaphragm 263 is positioned on the illumination optical axis. Which of the aperture diaphragms 246 and 263 is selected is determined according to the step amount and fineness of the wafer marks WM, the line width, and similar. This is well-known as described in Japanese Unexamined Patent Application, First Publication No. H08-306609, and so a detailed description is here omitted. An illumination aperture diaphragm 263 such as that shown in FIG. 3A can also be used together with a phase difference plate 263 as described below, and through this use, the alignment sensor 200 can be made to function as a phase difference microscope-type sensor. In this case, the ring-shape transmission portion 263a of the illumination aperture diaphragm 263 is set such that the image thereof enters into the phase difference imparting portion 264a of the ring shape on the phase difference plate 264, described below.

The beam reflected by the illumination area comprising the wafer marks WM on the wafer W is incident on the imaging aperture diaphragm 249 having a circular aperture portion. The diaphragm is positioned in the plane (called the imaging system pupil plane) H2 which is in an optical Fourier transform relation with the surface of the wafer W via the objective lens 248 and beam splitter 247. As this imaging aperture diaphragm 249, a well-known imaging aperture diaphragm comprising a blocking portion with a ring blocking shape such as that of Japanese Unexamined Patent Application, First Publication No. H08-306609 may be configured to enable insertion in the imaging optical path, to enable dark field detection in combination with the above-described illumination aperture diaphragm 263. It is preferable that, if the wafer marks are low step marks, dark field detection be used, and if the marks are high step marks, the imaging diaphragm be retracted from the optical path so that the bright field detection method is used.

As described above, when adopting an illumination aperture diaphragm 263 such as shown in FIG. 3A as the illumination aperture diaphragm, the phase difference plate 264 is inserted and positioned in the reducing (projection) optical path in proximity to the imaging aperture diaphragm 249, and the beam reflected from the wafer W is made incident on the phase difference plate 264 together with the imaging aperture diaphragm 249. As shown in the side view of FIG. 3B and in the bottom view of FIG. 3C, phase difference plate 264 comprises a ring-shaped phase difference imparting portion 264a affixed to the bottom face of a circular glass substrate; when used, the diaphragm is set such that, as described above, an image of the ring-shaped transmission portion 263a of the illumination aperture diaphragm 263 enters into the ring-shaped phase difference imparting portion 264a on the phase difference plate 264.

In this embodiment, the phase difference plate 264 is set so as to impart a phase difference of $+\pi/2$ (rad) or $-\pi/2$ (rad) between the imaging beam passing through the phase difference imparting portion 264a and the imaging beam passing through portions other than this. To this end, if the wavelength or central wavelength of the imaging beam is $\lambda$, then the phase difference imparting portion 264a (or portions other than this) should be formed as a thin film of refractive index n and thickness d so as to satisfy the equation $(n-1)d=\lambda/4$.

Figure 3B:
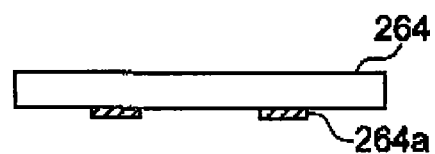
FIG. 3B is a side view used to explain the phase difference plate of the alignment sensor shown in FIG. 2.
Figure 3C:
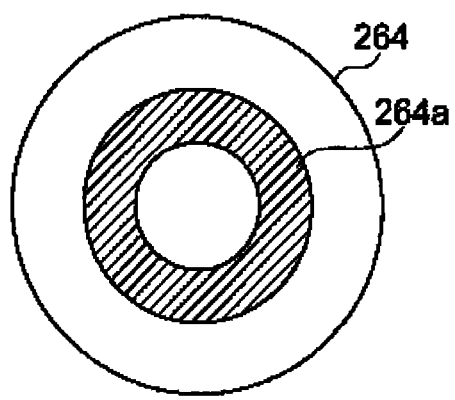
FIG. 3C is a bottom view used to explain the phase difference plate of the alignment sensor shown in FIG. 2.

By applying a phase difference microscope-type optical system to the alignment sensor 200 using an illumination aperture diaphragm 263 such as shown in FIG. 3A and a phase difference plate 264 such as shown in FIG. 3B and FIG. 3C, high-contrast detection images can be obtained even for extremely low step wafer marks WM. The phase difference imparting portion 264a shown in FIG. 3B and FIG. 3C may also be provided with a light-reducing action to further attenuate the transmitted beam. That is, a metal thin film or other light-absorbing member may be added to the phase difference imparting portion 264a.

The beam transmitted by the imaging aperture diaphragm 249 is condensed by the imaging lens 250, passes through the beam splitter 251, and forms an image of the wafer marks WM on the index plate 252. On the index plate 252 are formed index marks 252a and 252b. Furthermore, an index plate illumination system comprises a light-emitting diode (LED) or other light source 255, condenser lens 256, index illumination field diaphragm 257, lens 258, and similar, and is set such that the illumination light from this index plate illumination system passes through the beam splitter 251 and illuminates only partial areas comprising the index marks 252a and 252b. The shape of the transmission portion of the illumination field diaphragm 244 is set such that the partial areas comprising the index marks 252a and 252b are not illuminated, and light is blocked. Hence images of the wafer marks WM are not formed in superposition on the index marks 252a and 252b.

The images of wafer marks WM formed on the index plate 252, and the beam from the index marks 252a and 252b, are condensed on the CCD or other image capture device 254 via the relay lens 253. As a result, images of wafer marks WM and images of the index marks 252a and 252b are formed on the image-capture face of the image capture device 254. Image capture signals SV from the image capture device 254 are output to the main control system 300, and in the main control system 300 position information for the marks is computed.

Figure 4:
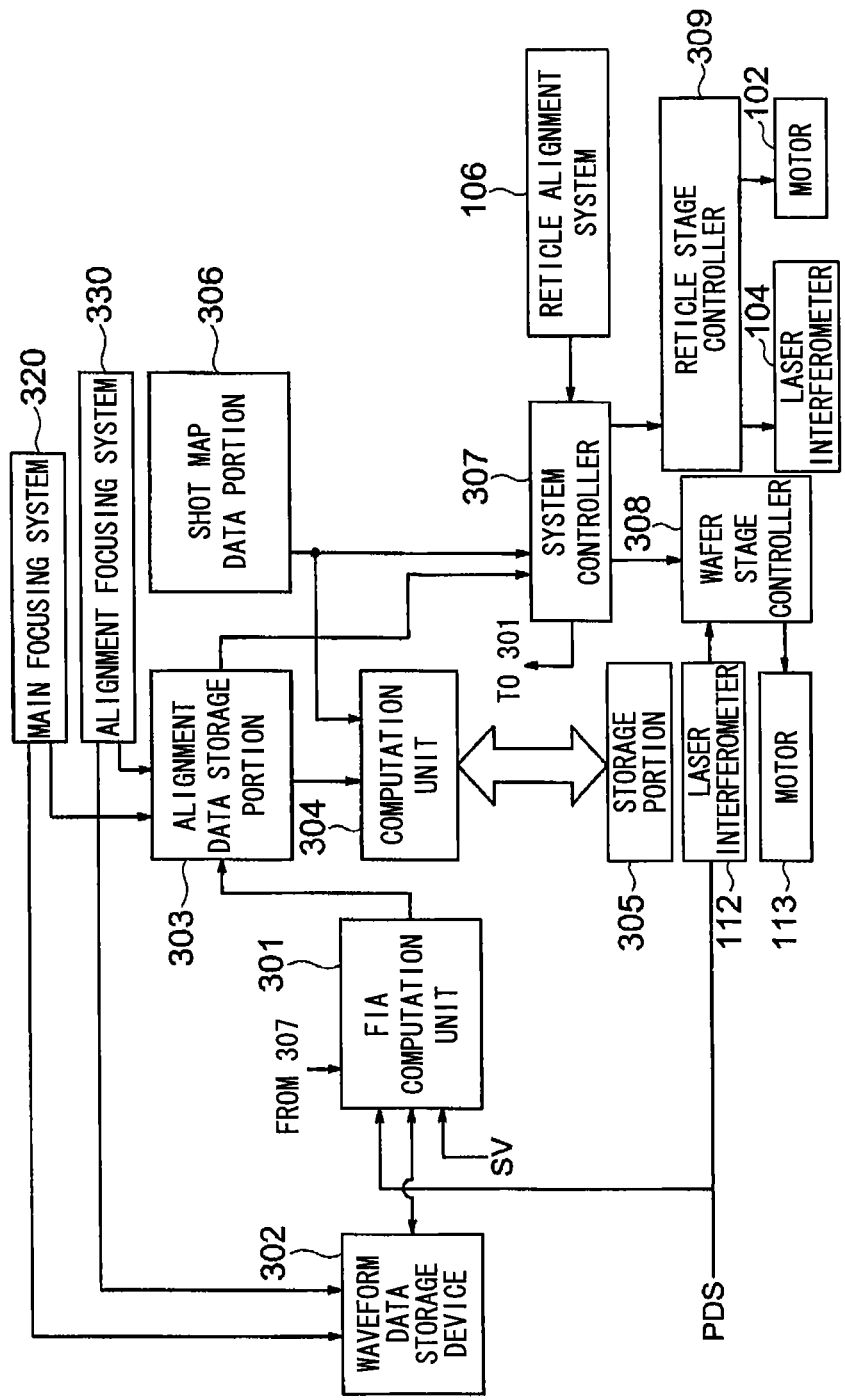
FIG. 4 shows the configuration of the main control system of the exposure apparatus shown in FIG. 1.

Next, the configuration of the main control system 300 is described. FIG. 4 is a block diagram showing the internal configuration of the main control system 300 and constituent elements related thereto. In FIG. 4, constituent elements which are the same as elements portions in FIG. 1 are assigned the same symbols. As shown in FIG. 4, the main control system 300 has a FIA computation unit 301, waveform data storage device 302, alignment data storage portion 303, computation unit 304, storage portion 305, shot map data portion 306, system controller 307, wafer stage controller 308, reticle stage controller 309, main focusing system 320, and alignment focusing system 330.

The waveform data storage device 302 is a circuit which stores image capture signals (waveform data) SV detected by the alignment sensor 200 and supplied via the FIA computation unit 301, as well as output signals from the main focusing system 320 and alignment focusing system 330. The waveform data storage device 302 stores signal waveforms for various alignment marks provided on the wafer W and for wafer fiducial marks WFM formed on the reference plate 110 provided on the wafer holder 108. On the wafer W (FIG. 6) described below, one-dimensional X marks and Y marks are formed separately accompanying each shot area. In such cases, the waveform data for the X marks and Y marks is stored separately in the waveform data storage device 302. No constraints are imposed on the mark shape, but the marks may be marks of a shape enabling simultaneously measurement in two dimensions.

The FIA computation unit 301 reads waveform data from the waveform data storage device 302 as necessary, determines position information, that is, coordinate positions in the stage coordinate system (x,y) for each mark (waveform data), and outputs the position information thus determined to the alignment data storage portion 303. The FIA computation unit 301 performs processing to generate waveform data or to detect coordinate positions from waveform data and other processing according to a prescribed signal processing algorithm specified by the system controller 307.

Figure 5A:
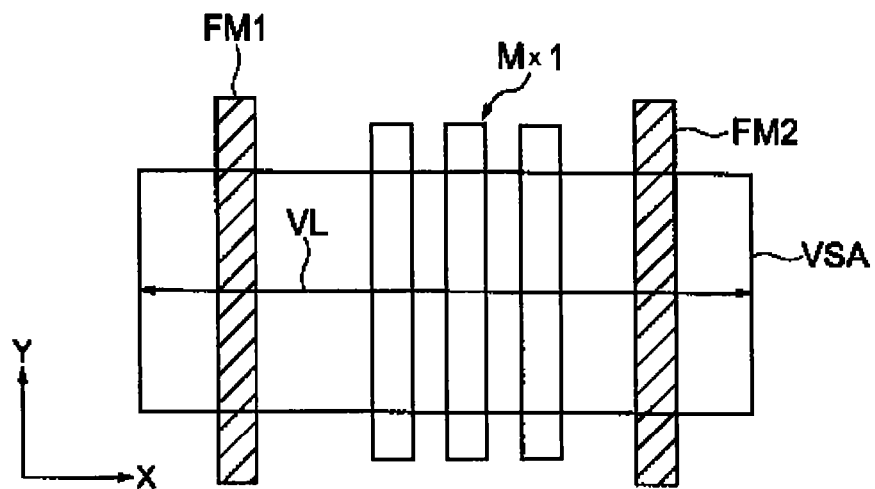
FIG. 5A shows an image of wafer marks captured by the image capture device of the alignment sensor shown in FIG. 2.
Figure 5B:
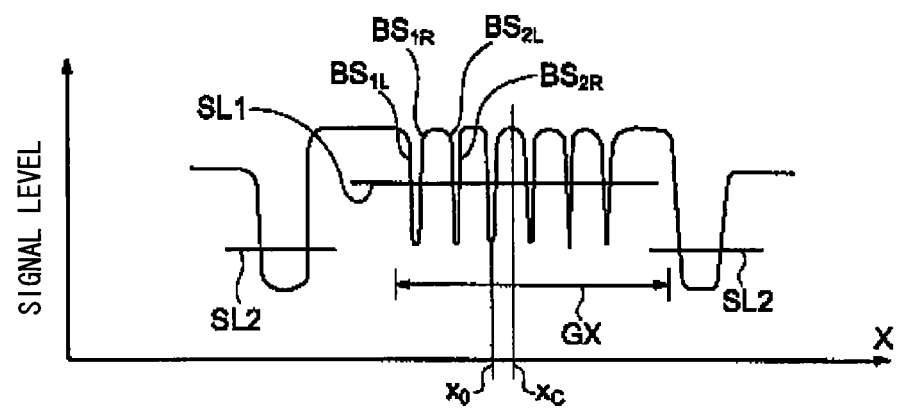
FIG. 5B shows a signal waveform when the image of wafer marks shown in FIG. 5A is captured by the image capture device of the alignment sensor shown in FIG. 2.

One example of processing to detect mark positions in the FIA computation unit 301 is described referring to FIG. 5. FIG. 5A shows marks Mx1 for position detect in the X axis direction, captured by the image capture device 254 (see FIG. 2) of the alignment sensor 200; FIG. 5B shows the image capture signal waveform obtained. As shown in FIG. 5A, a plurality of marks Mx1 which are straight patterns, and index marks FM1, FM2 formed on the index plate 252 (see FIG. 2) so as to enclose the marks Mx1, are positioned within the image capture field VSA of the image capture device 254. The image capture device 254 electrically scans the images of these marks Mx1 and index marks FM1, FM2 along the horizontal scan line VL. At this time, because a single scan line alone is disadvantageous from the standpoint of the SN ratio, it is desirable that the image capture signal levels for a plurality of horizontal scan lines within the image capture field VSA be added and averaged for each pixel in the horizontal direction. As a result, an image capture signal is obtained with depressions corresponding to the index marks FM1 and FM2 on both sides, as shown in FIG. 5B, and the image capture signal is stored in the waveform data storage device 302 via the FIA computation unit 301.

The FIA computation unit 301 detects the depressions in this image capture image at slice level SL2, and determines the center positions of the pixels of both depressions. Then, the reference position $x_0$ is determined as the center of these two center positions, when the index marks FM1 and FM2 are used as reference. Instead of determining the center positions of the index marks FM1, FM2, the right-edge position of the index mark FM1 and the left-edge position of the index mark FM2 may be used to determine the reference position $x_0$.

As shown in FIG. 5B, the waveform for the portion corresponding to the marks Mx1 in the image capture signal has depressions at positions corresponding to the left edges and right edges of each of the straight patterns. The FIA computation unit 301 detects the depressions corresponding to the marks Mx1 of this image capture signal at slice level SL1, and after determining the center positions of each straight pattern, averages the center positions to compute the measured position $x_c$ of the marks Mx1. Then, the difference $\Delta x$ ($=x_0-x_c$) is computed from the previously determined reference position $x_0$ and the measured position $x_c$ of the marks Mx1. Then, the value obtained by adding the computed difference $\Delta x$ to the coordinate position of the wafer stage 109 at the time of positioning of the wafer marks Mx1 in the image capture area VSA of FIG. 5A is supplied, as the mark position information, to the alignment data storage portion 303.

In the FIA computation unit 301 which performs this processing, there are, as selectable signal processing conditions (alignment measurement conditions), the waveform analysis algorithm, slice level SL1, processing gate width GX in FIG. 5B (the pixel center position and width of Gx), and similar. Furthermore, as the waveform analysis algorithm, when determining the center positions of each of the straight patterns, among the slope portions $BS_{1L}$, $BS_{2L}$ and $BS_{1R}$, $BS_{2R}$ corresponding to the left edge and right edge of the straight patterns as shown in FIG. 5B, there are (1) a mode in which the outside slope portions $BS_{1L}$ and $BS_{2R}$ alone are used, (2) a mode in which the inside slope portions $BS_{1R}$ and $BS_{2L}$ alone are used, and (3) a mode in which the outside slope portions $BS_{1L}$ and $BS_{2R}$ and the inside slope portions $BS_{1R}$ and $BS_{2L}$ are used, as for example disclosed in Japanese Unexamined Patent Application, First Publication No. H04-65603.

The alignment data storage portion 303 stores the positions of each mark detected by the FIA computation unit 301. Moreover, when wafer fiducial marks WFM input from the reticle alignment system 106 are observed using the reticle alignment system 106, the coordinate positions (position information in the coordinate system of the projection optical system PL) are stored via the system controller 107. Each of the coordinate positions stored in the alignment data storage portion 303 is supplied to the computation unit 304, and is supplied to EGA processing, baseline measurement processing and similar.

Position information stored in the alignment data storage portion 303 is directly supplied as needed to the system controller 307. For example, in the case of multistage processing to perform fine measurements after positioning of the wafer W based on the results of rough measurements, in cases in which marks formed on the wafer W include marks to measure position information in the X axis direction and separate marks to measure position information in the Y axis direction, and in cases in which the wafer W is moved based on the results of measurements of marks to measure position information in the X axis direction, and then marks for measurement of position information in the Y axis direction are measured, the position information stored in the alignment data storage portion 303 is directly supplied to the system controller 307.

The shot map data storage portion 306 stores design array coordinate values in the coordinate system (x,y) on the wafer W of marks belonging to each shot area on the wafer. These design array coordinate values are supplied to the computation unit 304 and system controller 307.

The computation unit 304 detects EGA parameters. That is, conversion parameters are determined in order to determine array coordinate values for computation in the stage coordinate system (x,y) from the design array coordinate values in the coordinate system (x,y) on the wafer W using the least-squares method, based on the measured coordinate values and design coordinate values; these conversion parameters are stored in the storage portion 305.

The computation unit 304 also computes the distance between the optical axis of the alignment sensor 200 and the optical axis AX of the projection optical system PL, that is, the baseline value, by detecting the distance between the position coordinates of wafer fiducial marks WFM measured by the alignment sensor 200 and stored in the alignment data storage portion 303 and the position coordinates of the wafer fiducial marks WFM measured by the reticle alignment system 106 via the projection optical system PL. In this embodiment, the baseline value is measured separately for each alignment measurement condition set (used) at the time of mark measurements. Furthermore, each detected baseline value is stored in the storage portion 305 in association with the preset alignment measurement conditions.

The system controller 307 determines the array coordinate values for computation in the stage coordinate system (x,y) from the design array coordinate values in the wafer W coordinate system (x,y), using the EGA parameters determined by the computation unit 304 and stored in the storage portion 305. The system controller 307 then drives the wafer stage 109 via the motor 113, while monitoring values measured by the laser interferometer 112 via the wafer stage controller 308, positions each shot area on the wafer W, and performs exposure of each shot area.

Moreover, the system controller 307 adjusts the position of the reticle R by driving the reticle stage 103 via the motor 102, while monitoring values measured by the laser interferometer 104 via the reticle stage controller 309.

Next, processing relating to this invention in an exposure apparatus 100 configured as described above is described. The exposure apparatus 100 precisely detects the positions of the wafer W set on the wafer stage 109 (on the wafer holder 108) and of a plurality of shot areas provided on the wafer W, performs precise positioning (alignment) of these at desired positions, and projects an image of a pattern formed on the reticle R onto each shot area to perform exposure. Here, processing to measure the positions of marks formed on the wafer at the time of this alignment processing, and processing to detect the baseline value in relation to this, are described for first through fourth specific processing examples. All of the processing described below is accomplished by having the main control system 300 of the exposure apparatus 100 perform operations according to a control program set in the main control system 300, by which means each of the portions of the exposure apparatus 100 is controlled.

Figure 6:
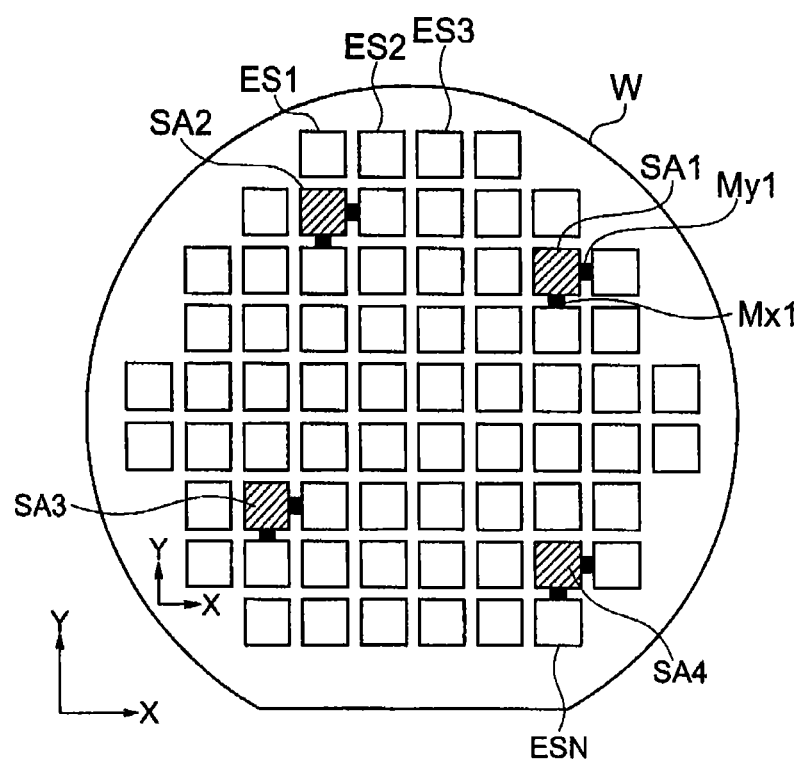
FIG. 6 is a diagram used to explain the arrangement of shots on the wafer, and the placement of sample shots and alignment marks.

First, the array of shot areas on the wafer W to be exposed in the exposure apparatus 100, and the alignment marks formed on the wafer W, are described referring to FIG. 6. FIG. 6 shows an array of shot areas on the wafer W, and the arrangement of sample shots and alignment marks. As shown in FIG. 6, the shot areas ES1, ES2, ..., ESN are provided on the wafer W regularly along the axes of the coordinate system (x,y) set on the wafer W. In each shot area ESi (i=1 to N), the layers of patterns formed up to this process are layered. Furthermore, each shot area ESi is delimited by street-lines of prescribed width in the x direction and y direction.

On this wafer W, marks (X marks) to measure the positions in the X-axis direction of each of the shot areas ESi, and marks (Y marks) to measure the positions in the Y-axis direction, are formed separately. That is, X marks Mxi to perform alignment in the X-axis direction are formed in the street-line areas extending in the x direction which are in contact with each shot area ESi, and Y marks Myi to perform alignment in the Y-axis direction are formed in the street-line areas extending in the y direction which are in contact with each shot area ESi. In this embodiment, the marks Mxi and Myi are marks arranged in a plurality of straight patterns with prescribed pitch in the x direction and y direction respectively, as shown in FIG. 5.

On the wafer W, it is assumed that the measurement conditions when measuring marks using the alignment sensor 200 are different for X marks and for Y marks. Such a state may occur for various reasons; but in this embodiment, it is assumed as one example that, as described for example in Japanese Patent No. 2591746 and Japanese Unexamined Patent Application, First Publication No. H07-249558, when it is necessary to perform alignment spanning a plurality of layers formed on a substrate (multiple layers) in order to superpose and expose the next layer, alignment in the Y direction is for example performed relative to the immediately preceding layer (as reference), and alignment in the X direction is performed relative to the layer preceding the former layer (as reference). More specifically, Y-direction positioning is performed for a pattern (marks) formed in the uppermost layer among the pattern layers previously formed on the wafer W, and positioning in the X direction is performed relative to a pattern (marks) formed in the layer below the uppermost layer. Hence when X marks are observed during alignment measurements, the X marks formed in the layer below the uppermost layer are observed via the uppermost layer in which the Y marks are formed on the wafer W. Consequently, alignment measurement conditions to perform appropriate measurements of the X marks (illumination conditions, optical conditions, signal processing algorithm, and similar) differ from the alignment measurement conditions to appropriately measure the Y marks.

In FIG. 6, shot areas SA1 to SA4 which are diagonally shaded represent sample shot areas when EGA is applied to the wafer W, and will be referenced when subsequently describing various processing examples.

Below, first through fourth processing examples are described as processing of this invention in an exposure apparatus 100, when such a wafer W is the object of processing.

<First Processing Example>

Figure 7:
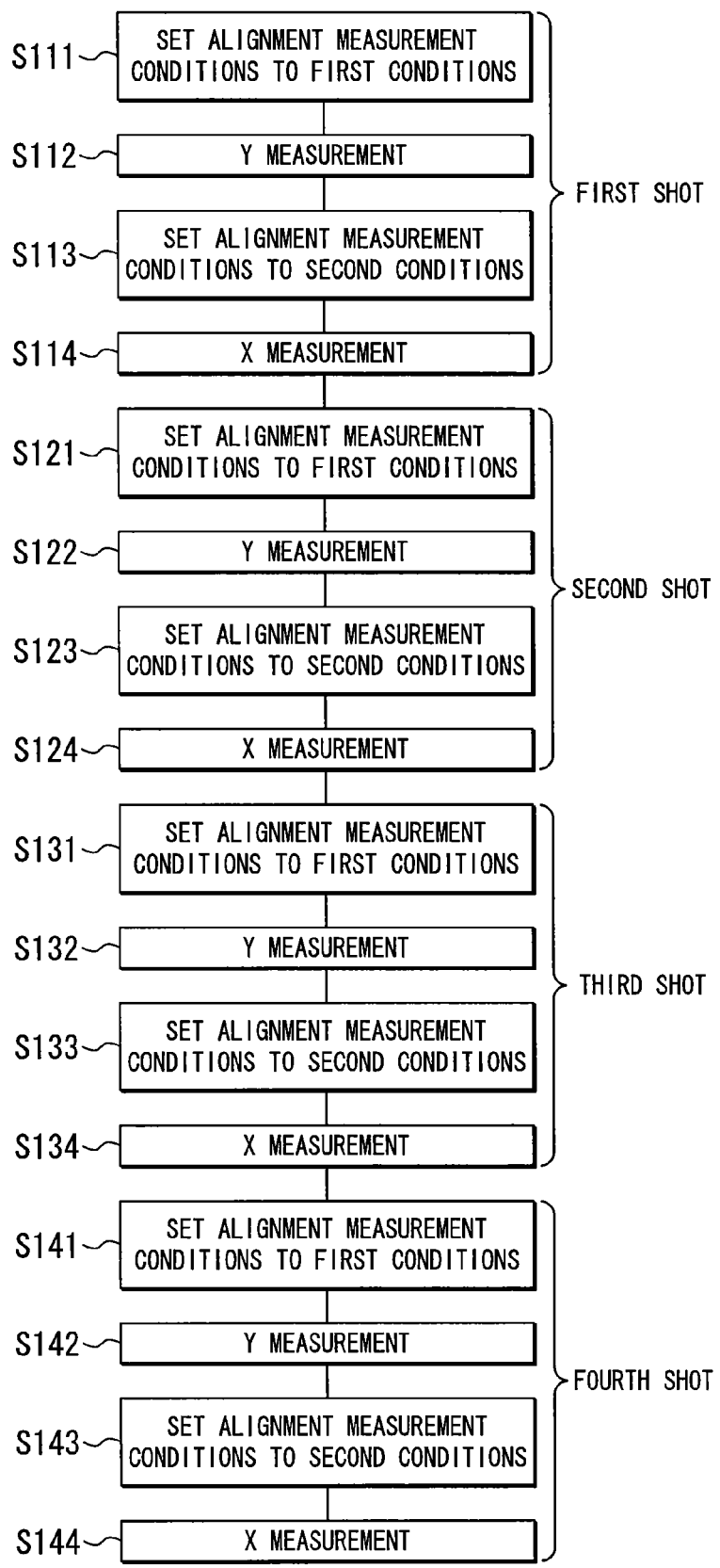
FIG. 7 shows the flow of measurement processing in which measurement conditions are changed for each axis direction.

As the first processing example for the exposure apparatus 100, processing is described, referring to FIG. 7, in which the positions of each of the shot areas on the above-described wafer W are detected using the EGA method. To this end, first, a prescribed number (three or more) of shot areas are selected as sample shots from among the shot areas ES1 to ESN on the wafer W, and the coordinate positions in the stage coordinate system (x,y) of each sample shot are measured. In this embodiment, for example, four shot areas SA1 to SA4, indicated by diagonal shading in FIG. 6, are selected. By then measuring the positions of the X marks Mx1 to Mx4 and the Y marks My1 to My4 formed in contact with each of these sample shot areas SA1 to SA4, the positions of the sample shot areas SA1 to SA4 are measured.

A feature of this first processing example is the fact that marks (X marks and Y marks) are measured for each shot in order, and that the measurement conditions are switched upon each shot measurement (for measurement of each mark). First, the system controller 307 of the main control system 300 moves the wafer stage 109 via the wafer stage controller 308 based on a shot map stored in the shot map data portion 306, and positions the Y mark My1 for position measurement in the Y axis direction, provided for the sample shot SA1, within the measurement field of the alignment sensor 200. Furthermore, the system controller 307 executes control of settings of each of the portions within the alignment sensor 200 and main control system 300 so as to set the alignment measurement conditions (first conditions) which are optimal for observing and capturing an image of the Y mark My1 and measuring the position thereof (step S111). Specifically, the Y mark My1 is for example formed on the uppermost layer of the pattern layer formed on the wafer W, and so there is no particular need to limit the wavelength of the observation light (illumination light) for observation of the mark, and observation may be performed using broad-band white light. Hence the system controller 307 controls the wavelength selection mechanism 243 such that the filter to pass a beam with wavelengths from 530 to 800 nm (white light) is selected in the wavelength selection mechanism 243 of the alignment sensor 200.

As alignment measurement conditions other than the above-described alignment light wavelength, the main control system 300 (system controller 307) controls the illumination field diaphragm 244, illumination aperture diaphragm 246, imaging aperture diaphragm 249, and index illumination field diaphragm 257, and controls the optical system numerical aperture N.A., σ, and illumination light quantity (light sources 241 and 255) of the alignment sensor 200 and similar. Furthermore, the main control system 300 (system controller 307) also executes control as necessary (as alignment measurement conditions (first conditions)) to switch and position an illumination aperture diaphragm placed in a stage beyond the relay lens 245 between the illumination aperture diaphragm 246 having a normal circular transmission portion and the illumination aperture diaphragm 263 having a ring-shaped transmission portion 263*a* as shown in FIG. 3A (modification of illumination conditions), or to insert or remove a diaphragm (not shown) having a ring-shaped blocking portion (a blocking portion which blocks 0th order diffracted light from marks) in place of the diaphragm 249 as the above-described imaging aperture diaphragm so as to switch between dark-field and bright-field detection methods, or to insert and position a phase difference plate 264 at a position in proximity to the imaging aperture diaphragm 249 beyond the imaging aperture diaphragm 249, causing the alignment sensor 200 to function as a phase-difference microscope type sensor.

Furthermore, the system controller 307 controls the FIA computation unit 301 so as to select, as the signal processing algorithm (one alignment measurement condition) used by the FIA computation unit 301 of the main control system 300, the optimum algorithm for measurement of the Y mark My1.

The Y mark My1 which is the measurement object is positioned within the measurement field, and when the alignment measurement conditions are set to the conditions which are optimum for measurement of the Y mark My1 (the first conditions), measurement of the Y mark My1 is performed (step S112). That is, illumination light emitted from the light source 241 is made incident on the area for detection comprising the mark My1 which is the measurement object, and light reflected from the area for detection is converted into image capture signals by the image capture device 254. The image capture signals of the captured Y mark My1 image are transferred from the alignment sensor 200 to the main control system 300, and are stored in the waveform data storage device 302 of the main control system 300.

When the waveform data has been stored in the waveform data storage device 302, the FIA computation unit 301 reads this data, and performs signal processing according to the signal processing conditions set in step S111, that is, using the prescribed algorithm, computation processing, slice level and similar which have been selected, to detect marks from the captured image and determine their positions. When the Y mark My1 is detected from the captured image signal, the position coordinates are stored in the alignment data storage portion 303, and measurement of the coordinate (Y coordinate) of the Y mark My1 for the first sample shot area SA1 is completed.

When coordinate measurement of the Y mark My1 for the first sample shot area SA1 is completed, next coordinate measurement is performed for the X mark Mx1 for the first sample shot area SA1. First, the system controller 307 of the main control system 300 moves the wafer stage 109 via the wafer stage controller 308 based on the shot map stored in the shot map data portion 306, and based on the relative design values of the coordinates of the Y mark My1 which is the current measurement object and of the coordinates of the X mark Mx1 which is the next measurement object as well as on the position information of the Y mark My1 currently being measured, and causes the X mark Mx1 for position measurement in the X axis direction, provided for the sample shot SA1, to be positioned within the measurement field of the alignment sensor 200.

The system controller 307 controls the settings of each portion within the alignment sensor 200 and main control system 300 so as to become alignment measurement conditions (second conditions, different from the above first conditions) suitable for observation, image capture, and measurement of the position of the X mark Mx1. Specifically, for example, the X mark Mx1 is a mark formed in the layer which is one layer below the uppermost layer of the pattern layer formed on the wafer W, as described above, and so, as observation light for appropriate observation thereof, use of observation light (illumination light) with a high transmissivity for the material comprised by the uppermost layer is preferable. For example, if this observation light is red light, then the system controller 307 controls the wavelength selection mechanism 243 so as to select a filter which transmits a beam of wavelength 710 to 800 nm (red light) in the wavelength selection mechanism 243 of the alignment sensor 200.

Furthermore, and similarly to the above description for the case of the Y mark My1, the main control system 300 (system controller 307) controls settings as necessary of the light sources 241 and 255, control of the diaphragms 244, 246, 249 and 257, selection of the illumination aperture diaphragm, positioning of the phase difference plate, signal processing conditions in the FIA computation unit 301 of the main control system 300, and similar, as alignment measurement conditions (second conditions), such that measurement conditions for measurement of the X mark Mx1 are optimum.

When the X mark Mx1 which is the measurement object is positioned within the measurement field, and the measurement conditions are set to the optimum conditions for measurement of the X mark Mx1, measurement of the X mark Mx1 is performed (step S114). That is, red illumination light emitted from the light source 241 is made incident on the detection area comprising the X mark Mx1 which is the measurement object, and light reflected from the detection area is converted into an image capture signal by the image capture device 254. The signal for the captured image of the X mark Mx1 is transferred from the alignment sensor 200 to the main control system 300, and is stored in the waveform data storage device 302 of the main control system 300.

When the waveform data is stored in the waveform data storage device 302, the FIA computation unit 301 reads this data, performs signal processing according to the signal processing conditions set in step S113, that is, using the prescribed algorithm, computation processing, slice level and similar which have been selected, and detects the mark from the captured image. When the X mark Mx1 is detected from the image capture signal, the position coordinates are stored in the alignment data storage portion 303, and measurement of the first mark X coordinate is completed.

When measurement of the Y mark My1 and X mark Mx1 for the first sample shot is completed, position measurements are similar performed of the Y marks and X marks for the second through fourth sample shots. That is, for example, the wavelength band of the illumination light, as one alignment measurement condition, is switched to broad-band white light (broad-band illumination), and other parameters are similarly set to measurement conditions (first conditions) appropriate for measurement of Y marks (step S121), and position measurement of the Y mark My2 for the second sample shot SA2 is performed (step S122). Next, for example the wavelength band of the illumination light, as one alignment measurement condition, is switched to red light (red illumination), and other measurement conditions appropriate for X mark measurement (second conditions) are similarly set (step S123), and position measurement of the X mark Mx2 of the second sample shot SA2 is performed (step S124).

Similarly for the third and fourth sample shots SA3 and SA4, for example the wavelength band of the illumination light, as one alignment measurement condition, is switched to broad-band white light (broad-band illumination), and other parameters are similarly set to measurement conditions appropriate for Y mark measurement (first conditions) (steps S131 and S141), and position measurements of the Y marks My3 and My4 for the third and fourth sample shots SA3 and SA4 are performed (step S132 and S142). Next, for example the wavelength band of the illumination light, as one alignment measurement condition, is switched to red light (red illumination), and other parameters are similarly set to measurement conditions appropriate for X mark measurement (second conditions) (steps S133 and S143), and position measurements of the X marks Mx3 and Mx4 for the third and fourth sample shots SA3 and SA4 are performed (step S134 and S144).

By repeating the above processing, and measuring in order each of the marks Mx1, My1, Mx2, My2, Mx3, My3, Mx4, My4 for the sample shots SA1 to SA4 set on the wafer W, alignment mark position measurements are completed. The measured coordinate values are supplied to the computation unit 304 via the alignment data storage portion 303 of the main control system 300. The computation unit 304 uses, for example, the least-squares method to determine parameters satisfying the prescribed EGA calculation formulae, set in advance, from the design coordinate values of the marks and the measured coordinate values. Then, the computation unit 304 applies the parameters thus determined and the design array coordinate values for the shot areas ESi to the EGA calculation formulae, to determine the calculated array coordinate values for each shot area ESi.

Thereafter, exposure processing is performed based on the array coordinate values thus obtained. When performing array processing, the baseline value, which is the difference between the calculation center of the alignment sensor 200 and the reference point in the exposure field of the projection optical system PL, has been determined in advance. The system controller 307 performs positioning in order of each of the shot areas ESi based on calculated coordinate values obtained by performing correction of the baseline value for the array coordinates calculated by the computation unit 304, and performs exposure using the pattern image of the reticle R.

Thus by means of this processing example, measurement conditions are switched for each layer measured (or in other words, for each X mark and Y mark; or in still other words, for measurements in the X-axis direction and in the Y-axis direction), so that measurements can be performed under the optimum conditions for each measurement object mark. Hence images of each mark are captured appropriately, and the mark positions are measured appropriately, so that positions can be measured precisely, and high-precision alignment can be performed.

<Second Processing Example>

As the second processing example of the exposure apparatus 100, processing is performed to detect the positions of each of the shot areas on the wafer W by the EGA method, similarly to the above-described first processing example; a method is described of continuously detecting the positions of alignment marks for each shot area, either by layer or by mark type (for alignment marks for the X-axis direction and for the Y-axis direction). The wafer W being processed, the array of shot areas, the selected sample shots, and the marks for position detect, are all the same as in the above-described first processing example.

Figure 8:
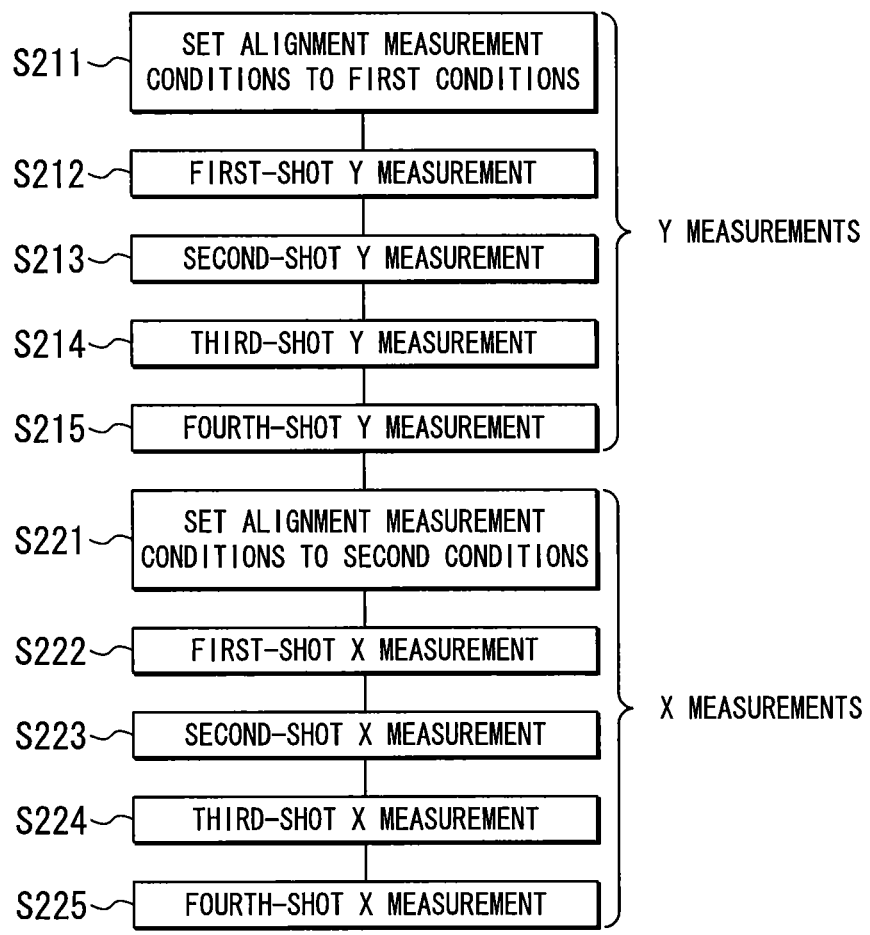
FIG. 8 shows the flow of processing to change the measurement conditions for each axis direction, and to perform measurements of mark positions continuously for each axis direction.

FIG. 8 is a flowchart showing the flow of processing in the mark position measurement method of the second processing example. First, the system controller 307 of the main control system 300 decides on alignment measurement conditions (first conditions) to be used by the alignment sensor 200 and main control system 300 to enable position measurement of the Y-axis direction alignment marks (Y marks) My1 to My4 for four sample shot areas SA1 to SA4 under the most desirable measurement conditions, and sets these conditions (step S211).

Alignment measurement conditions for selection (switching) and setting may include, for example, the amount of light emitted by the light source 241 for illumination light and by the light source 255 for index plate illumination light. Further conditions may be the contraction states of the illumination field diaphragm 244, illumination aperture diaphragm 246, imaging aperture diaphragm 249 (or the imaging aperture diaphragm comprising a ring-shaped blocking portion, described above), and index illumination field diaphragm 257. By controlling these components, the illumination conditions (normal illumination/modified illumination), dark-field/bright-field detection method, the numerical aperture N.A. and σ of the optical system, the illumination light quantity, and other settings can be controlled. Furthermore, by controlling the filter used in the wavelength selection mechanism 243, the wavelength of illumination light (measurement light) can be selected. And, as other alignment measurement conditions, the illumination aperture diaphragm can be modified from an illumination aperture diaphragm 246 having a normal circular transmission portion to an illumination aperture diaphragm 263 having a ring-shaped transmission portion 263a such as that shown in FIG. 3A, and, by positioning a phase difference plate 264 at a position in proximity to the imaging aperture diaphragm 249 beyond the imaging aperture diaphragm 249, control can be executed so that the alignment sensor 200 can be made to function as a phase difference microscope type sensor.

Signal processing conditions are also included as alignment measurement conditions, among which are selection of the waveform analysis (waveform processing) algorithm used by the FIA computation unit 301 of the main control system 300, the EGA calculation model used by the computation unit 304, and other signal processing algorithms, and selection of the various parameters used by each of the selected signal processing algorithms.

In this processing example, one alignment measurement condition (an example of one first condition) is, for example, optimization of the wavelength of illumination light in the alignment sensor 200. As described above, the Y marks My1 to My4 formed on the wafer W for processing are marks formed on the uppermost layer of the pattern layers which are layered on the wafer W, and there is no particular need to limit the wavelength of the observation light (illumination light) used to observe the marks, so that broad-band white light may be used for observations. Hence the system controller 307 makes settings (executes control) of the wavelength selection mechanism 243 such that a beam with wavelengths at 530 to 800 nm (white light) is transmitted within the wavelength selection mechanism 243 of the alignment sensor 200.

When measurement conditions have been set, position measurements of the Y marks My1 to My4 of the first through fourth sample shots SA1 to SA4 are performed continuously in order (Y-axis direction position measurements) (steps S212-S215).

First, the system controller 307 of the main control system 300 moves the wafer stage 109 via the wafer stage controller 308 based on the shot map stored in the shot map data portion 306, and positions the Y mark my1 for position measurement in the Y-axis direction, provided for the sample shot SA1, within the measurement field of the alignment sensor 200. When the Y mark My1 is positioned within the measurement field, the main control system 300 performs image capture of the Y mark My1 under the optimum measurement conditions, while controlling the measurement conditions of the alignment sensor 200, and performs position measurement thereof (step S212).

That is, illumination light emitted from the light source 241, which has passed through the wavelength selection mechanism 243 and illumination field diaphragm 244, irradiates the area for detection comprising the Y mark My1. Light reflected from the area for detection then passes through the imaging aperture diaphragm 249 and index plate 252 and similar, is received by the image capture device 254, and by means of photoelectric conversion, the image capture signal is generated. The image capture signal for the Y mark My1 thus obtained is transferred from the alignment sensor 200 to the main control system 300, and is stored in the waveform data storage device 302 of the main control system 300.

The image capture signal stored in the waveform data storage device 302 is read by the FIA computation unit 301, and signal processing is performed according to the signal processing conditions set in step S211, that is, using the preset processing algorithms and parameters. As a result, the Y mark My1 is extracted from the image capture signal, and the position of the mark is detected. The position information (coordinate value) of the detected Y mark My1 is stored in the alignment data storage portion 303. By this means, position measurement processing for the Y mark My1 of the first sample shot SA1 is completed.

When position measurement of the Y mark My1 for the first sample shot SA1 is completed, next position processing for the Y mark My2 of the second sample shot SA2 is performed (step S213). The system controller 307 of the main control system 300 moves the wafer stage 109 via the wafer stage controller 308 based on the shot map stored in the shot map data portion 306, based on the coordinate of the Y mark My1 for the first sample shot SA1 which is the current measurement object, the relative design value of the coordinate of the Y mark My2 for the second sample shot SA2 which is the next measurement object, and position information for the Y mark My1 of the first sample shot SA1 which has been measured, so that the Y mark My2 of the second sample shot SA2 is positioned within the measurement field of the alignment sensor 200.

Then, when the Y mark My2 is positioned within the measurement field, processing similar to the above-described measurement processing for the Y mark My1 of the first sample shot SA1 is performed, while the main control system 300 controls the measurement conditions of the alignment sensor 200, to perform image capture and position measurement of the Y mark My2 under the optimum measurement conditions. At this time, the immediately preceding measurement object mark is a Y mark for use in alignment in the same Y-axis direction as the mark which is the current measurement object; hence the same measurement conditions can be applied to perform measurement. That is, measurement of the Y mark My2 can be performed immediately following the Y mark My1, without modifying the measurement conditions.

Similarly, when position measurement of the Y mark My2 for the second sample shot SA2 is completed, the system controller 307 of the main control system 300 positions the Y mark My3 for the third sample shot SA3 within the measurement field of the alignment sensor 200, based on the shot map stored in the shot map data portion 306, and performs position measurement of the Y mark My3 for the third sample shot SA3 (step S214). Furthermore, when position measurement of the Y mark My3 for the third sample shot SA3 is completed, the Y mark My4 for the fourth sample shot SA4 is positioned within the measurement field of the alignment sensor 200, and position measurement of the Y mark My4 for the fourth sample shot SA4 is performed (step S215).

When position measurements of each of the Y marks My1 to My4 for the first through fourth sample shots SA1 to SA4 are completed, next position measurements of each of the X marks Mx1 to Mx4 for the first through fourth sample shots SA1 through SA4 are performed. To this end, the system controller 307 of the main control system 300 decides and sets the optimum alignment measurement conditions (second conditions) such that position measurements of the X marks Mx1 to Mx4 can be performed under the optimum measurement conditions (step S221).

In this processing example, similarly to the position measurements for the Y marks My1 to My4, the wavelength of the illumination light in the alignment sensor 200 is optimized as a measurement condition (an example of a second condition). The X marks Mx1 to Mx4 formed on the wafer W for processing are marks formed in the layer one below the uppermost layer of the pattern layers which are layered on the wafer W, as described above, and so in order to appropriately observe these marks, it is preferable that observation light (illumination light) be used which has high transmissivity which respect to the material of the uppermost layer. Here, such observation light is assumed to be for example red-colored light. In this case, the system controller 307 makes settings (executes control) in the wavelength selection mechanism 243 such that a filter which transmits a beam of wavelength 710 to 800 nm (red light) is selected in the wavelength selection mechanism 243 of the alignment sensor 200.

When the measurement conditions have been set, position measurements of the X marks Mx1 to Mx4 for the first through fourth sample shots SA1 to SA4 (X-axis direction position measurements) are performed continuously in order (steps S222 to S225).

Similarly to measurement of the Y mark My1, the system controller 307 of the main control system 300 moves the wafer stage 109 via the wafer stage controller 308 based on the shot map stored in the shot map data portion 306, and positions the X mark Mx1 for position measurement in the X-axis direction, provided for the sample shot SA1, within the measurement field of the alignment sensor 200. The main control system 300 then captures an image and performs measurement of the X mark Mx1 under the optimum measurement conditions, while controlling the measurement conditions of the alignment sensor 200 (step S222).

That is, red illumination light emitted from the light source 241 and passed through a red filter of the wavelength selection mechanism 243 irradiates an area for detection comprising the Y mark My1. Light reflected from the area for detection is then received by the image capture device 254 via the imaging aperture diaphragm 249, index plate 252 and similar, and through photoelectric conversion an image capture signal is generated. The image capture signal for the X mark Mx1 thus obtained is transferred from the alignment sensor 200 to the main control system 300, and is stored in the waveform data storage device 302 of the main control system 300.

The image capture signal stored in the waveform data storage device 302 is read by the FIA computation unit 301, and signal processing is performed according to the signal processing conditions set in step S221, that is, according to the preset processing algorithms and parameters. As a result, the X mark Mx1 is extracted from the image capture signal, and the mark position is detected. Position information for the detected X mark Mx1 (a coordinate value) is stored in the alignment data storage portion 303. By this means, position measurement processing of the X mark Mx1 for the first sample shot SA1 is completed.

When position measurement of the X mark Mx1 for the first sample shot SA1 is completed, next position measurement for the X mark Mx2 for the second sample shot SA2 is performed (step S223). The system controller 307 of the main control system 300 moves the wafer stage 109 via the wafer stage controller 308 so that the X mark Mx2 of the second sample shot SA2 is positioned within the measurement field of the alignment sensor 200, based on the shot map stored in the shot map data portion 306, and based on the coordinate of the X mark Mz1 for the first sample shot SA1 which is the current measurement object, the design relative value of the coordinate of the X mark Mx2 for the second sample shot SA2 which is the next measurement object, and position information for the X mark Mx1 for the first sample shot SA1 which has just been measured.

When the X mark Mx2 has been positioned within the measurement field, the main control system 300 performs processing similar to the measurement processing described above for the X mark Mx1 for the first sample shot SA1, while controlling the measurement conditions of the alignment sensor 200, and by this means performs image capture and position measurement of the X mark Mx2 under optimum measurement conditions. At this time, the immediately preceding measurement object mark is an X mark, used for alignment in the same X-axis direction as is the mark which is next to be measured, and so the same measurement conditions can be applied to perform measurement. That is, immediately following the X mark Mx1, measurement of the X mark Mx2 can be performed, without modifying the measurement conditions.

Similarly, when position measurement of the X mark Mx2 for the second sample shot SA2 is completed, the system controller 307 of the main control system 300 positions the X mark Mx3 for the third sample shot SA3 within the measurement field of the alignment sensor 200 based on the shot map stored in the shot map data portion 306, and performs position measurement of the X mark Mx3 for the third sample shot SA3 (step S224). When position measurement of the X mark Mx3 for the third sample shot SA3 is completed, the X mark Mx4 for the fourth sample shot SA4 is positioned within the measurement field of the alignment sensor 200, and position measurement is performed for the X mark Mx4 for the fourth sample shot SA4 (step S225).

By means of the above processing, position measurements of the marks My1 to My4 and Mx1 to Mx4 for the sample shots SA1 to SA4, provided on the wafer W, are completed. The measured coordinate values are supplied to the computation unit 304 via the alignment data storage portion 303 of the main control system 300. The computation unit 304 uses for example the least-squares method to determine parameters satisfying prescribed EGA formulae, set in advance, from the design coordinate values of the marks and the measured coordinate values. The computation unit 304 then applies the parameters thus determined and the design array coordinate values for each of the shot areas ESi to the EGA formulae, and determines the calculated array coordinate values for each shot area ESi.

Then, exposure processing is performed based on the array coordinate values thus determined. When performing exposure processing, the baseline values, which are the intervals between the calculation center of the alignment sensor 200 and reference points within the exposure fields of the projection optical system PL, are determined in advance. The system controller 307 then performs baseline value correction of the array coordinates computed by the computation portion 304, and based on the calculated coordinate values obtained, positions each of the shot areas ESi in order, and performs exposure to transfer pattern images of the reticle R onto each shot area. When exposure of all shot areas on one wafer W is completed, the wafer W is removed, and the next wafer from the same lot is subjected to similar processing.

In this processing example also, similarly to the first processing example, measurement conditions are switched for each layer (in other words, for X marks and for Y marks; in still other words, for X-axis direction measurements and for Y-axis direction measurements), so that measurements of each measurement object mark can be performed under the optimum conditions. Hence image capture is performed appropriately for each mark, and the position is measured appropriately, so that positions can be measured with high precision, and highly precise alignment can be performed. Furthermore, by means of this processing example, once measurement conditions for Y-axis direction marks (in the uppermost layer), or measurement conditions for X-axis direction marks (in the lower one below the uppermost layer), are set, the Y-mark measurements or X-mark measurements are performed continuously for all measurement shots (sample shots). Hence there is no need to modify the measurement conditions for measurement of each mark as in the first processing example (measurement conditions need be modified only once), and marks can be measured in order efficiently. That is, by using this processing to perform mark measurements, drops in throughput due to optimization of measurement conditions can be prevented.

<Third Processing Example>

As a third processing example for the exposure apparatus 100, measurement processing of the baseline value is described. The final position information used in controlling the position of the wafer stage 109 in order to perform exposure of each of the shot areas on the wafer W comprises values obtained by correcting position information for each of the shot areas computed using EGA based on the position measurement results of the alignment sensor 200 using baseline values, which are differences between reference positions within measurement fields of the alignment sensor 200 and reference positions within the projection fields of the projection optical system. In the above-described first processing example and second processing example, as a mark measurement method of this invention, different measurement conditions for each layer (in the X-axis direction and in the Y-axis direction) were used for mark detection and for position measurement; but as the baseline value used for the position information detected in this way, it is preferable that baseline values measured under the same measurement conditions as the alignment measurement conditions used by the alignment sensor be used. That is, when measurements are performed under different measurement conditions in the X-axis direction and in the Y-axis direction in the alignment sensor 200, as described above, it is appropriate that the baseline values applied to these measurements also be detected separately under the same conditions as the measurement conditions when performing position measurements (for each layer, or separately for the X-axis direction and for the Y-axis direction). In this processing example, processing to determine these baseline values is described, referring to FIG. 9.

Figure 9:
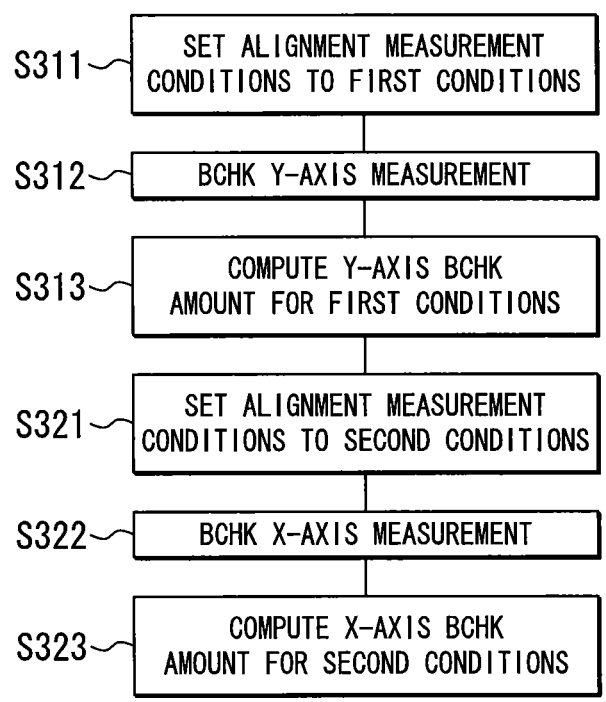
FIG. 9 shows the flow of processing to measure the baseline for each axis direction; and, FIG. 10 shows the flow of processing to perform repeated measurements of the baseline each time the measurement conditions are modified.

FIG. 9 is a flowchart showing the flow of processing for baseline measurement, as the third processing example. In the baseline measurement processing described by the flowchart of FIG. 9, first the baseline value in the Y-axis direction is computed (steps S311 to S313). To this end, the system controller 307 of the main control system 300 detects alignment measurement conditions (control conditions) appropriate for measurement of the positions of Y marks Myi in each of the shot areas of the wafer, and sets the measurement conditions to these same conditions (step S311). Here, similarly to the first and second processing examples, conditions are decided such that broad-band white light is used as the illumination light of the alignment sensor 200, and in actuality the illumination wavelength of the alignment sensor 200 is switched.

Then, measurement of the baseline in the Y-axis direction (BCHK: baseline check) is performed (step S312). That is, first the system controller 307 of the main control system 300 moves the wafer stage 109, and positions a wafer fiducial mark WFM on the reference plate 110 provided on the wafer stage 109 within the field of the reticle alignment system 106, and measures the Y-axis direction position information. Next, the system controller 307 of the main control system 300 moves the wafer stage 109, and positions the wafer fiducial mark WFM of the reference plate 110 provided on the wafer stage 109 within the measurement field of the alignment sensor 200. Then, while controlling the measurement conditions of the alignment sensor 200, the main control system 300 measures the position in the Y-axis direction of the wafer fiducial mark WFM. The wafer fiducial mark WFM used here may be a mark common to the X and Y axes (mark for two-dimensional measurement), or may be a mark for use only in Y-axis direction measurement (mark for one-dimensional measurement).

Then, in the system controller 307 of the main control system 300, the Y-direction distance between the optical axis of the alignment sensor 200 and the optical axis AX of the projection optical system PL is detected from this measured position information, and the result is used as the Y-direction baseline value (BCHK value) (step S313).

When computation of the baseline value in the Y-axis direction is completed, computation of the baseline value in the X-axis direction is performed (steps S321 to S323). The system controller 307 of the main control system 300 detects alignment measurement conditions (control conditions) to appropriately perform position measurement of the X marks Mxi for each shot area of the wafer, and sets the same measurement conditions as these (step S321). Here, similarly to the first and second processing examples, conditions are set such that red light is used as the illumination light of the alignment sensor 200.

Then, measurement of the baseline in the X-axis direction (BCHK: baseline check) is performed (step S322). That is, first the system controller 307 of the main control system 300 moves the wafer stage 109 to position the wafer fiducial mark WFM of the reference plate 110 provided on the wafer stage 109 within the field of the reticle alignment system 106, and measures the position information in the X-axis direction. Next, the system controller 307 of the main control system 300 moves the wafer stage 109 to position the wafer fiducial mark WFM of the reference plate 110 provided on the wafer stage 109 in the measurement field of the alignment sensor 200. The main control system 300 then measures the position in the X-axis direction of the wafer fiducial mark WFM, while controlling the measurement conditions of the alignment sensor 200. The wafer fiducial mark WFM used here may be a mark common to both the X and Y axes (mark for two-dimensional measurement), or may be a mark for use only in X-axis direction measurement (mark for one-dimensional measurement).

Then, in the system controller 307 of the main control system 300, the position information thus measured is used to detect the distance in the X direction between the optical axis of the alignment sensor 200 and the optical axis AX of the projection optical system PL, and this is taken to be the X-direction baseline value (BCHK value) (step S323).

Each of the baseline values in the X-axis direction and Y-axis direction measured in this way may be used to convert position information for each direction measured using the alignment sensor 200 into position information for a coordinate system with reference to the optical axis AX of the projection optical system PL when, for example, position measurements are performed under different measurement conditions for the X-axis direction and for the Y-axis direction, as in the above-described first and second processing examples.

In this way, baseline values are measured separately under conditions according to the measurement conditions for each of the X-axis direction and the Y-axis direction, and are held separately; by this means, appropriate conversion (correction) of position information values can be performed for mark position information results in the direction for each axis, so that so-called baseline errors can be suppressed. Hence high-precision alignment can be performed.

<Fourth Processing Example>

Similarly to the above-described first and second processing example, in this case the measurement conditions are switched during a series of alignment processing; but when the details of the measurement condition switching entail switching of filters in the wavelength selection mechanism 243, for example, or optical or mechanical movement such as movement of the phase difference plate 264, there is the possibility that such switching may be accompanied by errors in baseline values or similar. In order to cope with such situations, each time measurement conditions are switched, it is sufficient to execute baseline measurements even when processing wafers in the same lot. The fourth measurement example indicates processing to detect the positions of shot areas on the wafer W using the EGA method, while appropriately performing baseline measurements.

Figure 10:
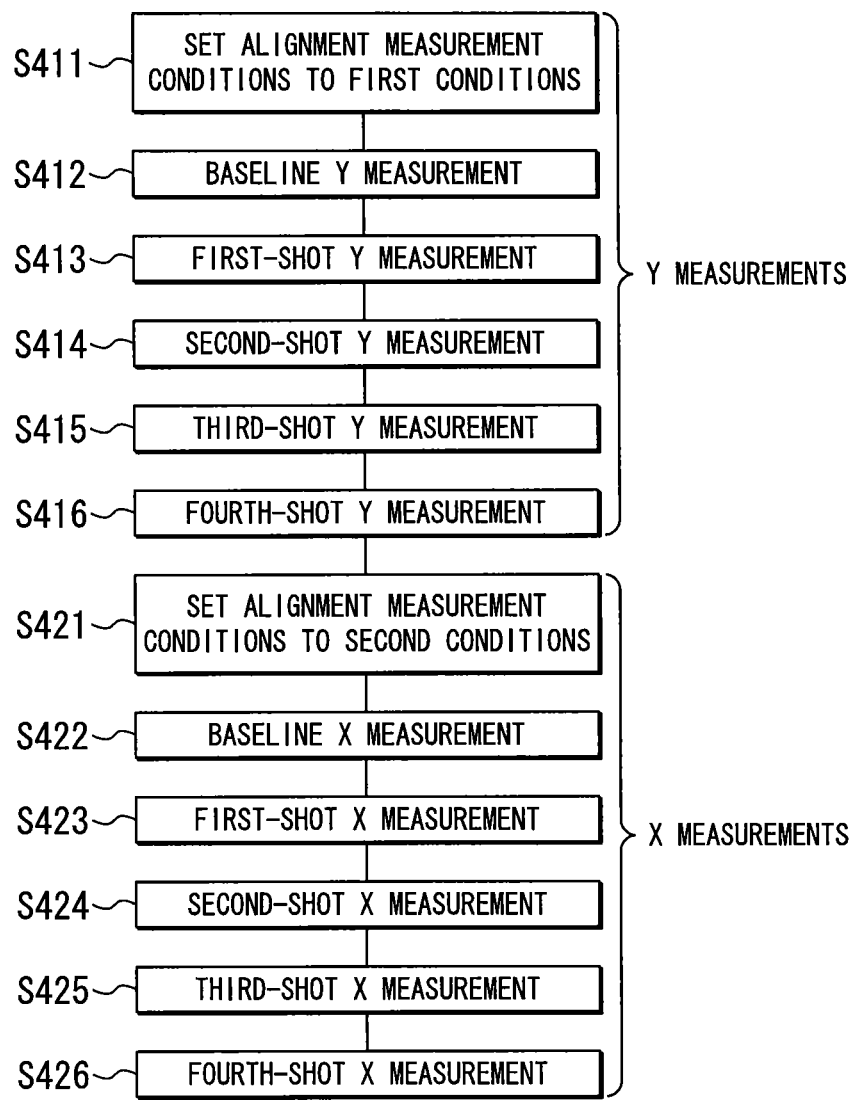

FIG. 10 is a flowchart showing the flow of processing in the mark position measurement method presented as the fourth processing example. This processing is essentially the same as the processing example presented as the above-described second processing example (FIG. 8). A difference between the processing in the fourth processing example and the second processing example is the fact that, when the alignment measurement conditions are modified, immediately thereafter the baseline value to be used is re-measured. Specifically, a step of re-measuring the baseline value in the Y-axis direction (step S412), and a step of re-measuring the baseline value in the X-axis direction (step S422), are added. In step S412, the baseline value is measured under the alignment conditions set in step S411 (first conditions); in step S422, the baseline value is measured under the alignment conditions set in step S421 (second conditions). The baseline value measurement method is that already described referring to FIG. 9; the other steps are as already described referring to FIG. 8, and so a description is here omitted.

By thus performing baseline measurements each time there is modification of the measurement conditions of the alignment sensor 200, even when slight fluctuations in the baseline or similar occur due to switching of measurement conditions, such fluctuations can immediately be accommodated, and as a result mark positions can be measured with high precision, and precise alignment can be performed.

These embodiments are described so as to facilitate understanding of the invention, and the invention is in no way limited to these embodiments. Each of the elements disclosed in the embodiments comprises all the design modifications and equivalent elements belonging to the technical scope of the invention, and various arbitrary appropriate modifications are possible.

For example, the configuration of the exposure apparatus 100, the configuration of the alignment sensor 200, and the configuration of the main control system 300, are not limited to the configurations shown in FIG. 1, FIG. 2, and FIG. 4 respectively.

In these embodiments, an off-axis type FIA system (imaging alignment sensor) was used as the alignment sensor 200 in descriptions; but other mark detection systems may be used. That is, TTR (Through-The-Reticle) type devices, TTL (Through-The-Lens) type devices, or off-axis type devices may be used, and moreover in addition to imaging methods (image processing methods) adopting FIA or similar as the detection method, for example methods employing diffracted light or scattered light for detection may be used. For example, an alignment system may be employed in which an alignment mark on the wafer may be irradiated substantially perpendicularly with a coherent beam, and diffracted light of the same orders (±1st, ±2nd, . . . , ±nth order diffracted light) from the mark may be caused to interfere to perform detection. In this case, diffracted light is detected independently by the diffraction order, and the detection results for at least one diffraction order may be used; or, a plurality of coherent beams with different wavelengths may be used to irradiate the alignment mark, and diffracted light of each order may be caused to interfere for each wavelength to perform detection.

Furthermore, the exposure apparatus is not limited to the step-and-scan type exposure apparatus of the above embodiments; the invention can be applied entirely similarly to various other types of exposure apparatus, such as step-and-repeat type and proximity type exposure apparatuses (X-ray exposure apparatuses and similar). Furthermore, the illumination light (or energy beam) used for exposure in the exposure apparatus is not limited to ultraviolet beams, but may be X rays (including EUV light), as well as electron beams, ion beams, and other charged particle beams or similar. Furthermore, the exposure apparatus may be used in the manufacture of DNA chips, masks, reticles, and similar.

This application relates to and claims priority from Japanese Patent Application No. 2004-128536, filed on Apr. 23, 2004, the entire disclosure of which is incorporated herein by reference.

The invention claimed is:

1. A measurement apparatus, which measures a plurality of X marks and a plurality of Y marks, which are measurement objects formed on a prescribed substrate, comprising:
   an illumination system which illuminates the X and Y marks;
   a light-receiving system which receives a beam generated from the illuminated X marks and a beam generated from the illuminated Y marks;
   a computation unit which processes a signal obtained by receiving the beam generated from the illuminated X marks by the light-receiving system, and processes a signal obtained by receiving the beam generated from the Y marks by the light-receiving system;
   a control system including a control program and a system controller, execution of the control program by the system controller causing the system controller to
      adjust at least one of the illumination system and the light-receiving system to set a measurement condition to a first condition when all of the X marks are measured among the marks which are the measurement objects on the prescribed substrate without measuring the Y marks, and to set the measurement condition to a second condition different from the first condition when all of the Y marks are measured without measuring the X marks, the X marks including all marks for measuring positions in a first direction in a two-dimensional plane on the substrate, the Y marks including all marks for measuring positions in a second direction orthogonal to the first direction in the two-dimensional plane on the substrate, and switch the measurement condition from the first condition to set the second condition after the measurement of all of the X marks on the prescribed substrate under the first condition,
wherein the first condition includes a signal processing condition to process, by the computation unit, the signal obtained by receiving the beam generated from the illuminated X marks by the light-receiving system, and the second condition includes a signal processing condition to process, by the computation unit, the signal obtained by receiving the beam generated from the illuminated Y marks by the light-receiving system.

2. An exposure apparatus, which transfers a pattern formed on a mask onto a substrate, comprising:
a positioning device which, for either one among the mask and the substrate, uses the measurement apparatus according to claim 1 to measure the positions of marks formed on the mask or on the substrate, and based on measurement results, performs positioning of the mask or of the substrate.

3. The measurement apparatus according to claim 1, wherein:
each of the X marks has line patterns that extend in a Y direction;
each of the Y marks has line patterns that extend in an X direction, the X direction being orthogonal to the Y direction.

4. The measurement apparatus according to claim 1, further comprising:
a retention apparatus configured to retain, for each of the set conditions, a baseline value, which is the interval between a reference position for measurements using the measurement apparatus and a reference position which specifies the position when performing desired processing of the substrate.

5. The measurement apparatus according to claim 1, wherein:
the signal processing condition to process the signal obtained by receiving the beam generated from the illuminated X marks includes at least one of:
a waveform analysis algorithm (a waveform processing algorithm) selected for processing a photoelectric converted signal, which is obtained by receiving the beam generated from the illuminated X marks,
a signal processing algorithm including EGA calculation model, and
a parameter selected for being used in the selected signal processing algorithm; and
the signal processing condition to process the signal obtained by receiving the beam generated from the illuminated Y marks includes at least one of:
a waveform analysis algorithm (a waveform processing algorithm) selected for processing a photoelectric converted signal, which is obtained by receiving the beam generated from the illuminated Y marks,
a signal processing algorithm including EGA calculation model, and
a parameter selected for being used in the selected signal processing algorithm.

6. The measurement apparatus according to claim 5, wherein
the light-receiving system comprises:
an imaging optical system configured to form an image of the illuminated X marks and am image of the illuminated Y marks; and
an image capture device configured to capture the image of the illuminated X marks and to output a corresponding capture signal, and to capture the image of the illuminated Y marks and to output a corresponding capture signal.

7. The measurement apparatus according to claim 5, wherein
the light-receiving system is configured to receive diffracted lights generated from the illuminated X marks and to make interference between same order diffracted lights among the diffracted lights generated from the illuminated X marks, and
the light-receiving system is configured to receive diffracted lights generated from the illuminated Y marks and to make interference between same order diffracted lights among the diffracted lights generated from the illuminated Y marks.

8. The measurement apparatus according to claim 5, wherein
the light-receiving system is configured to receive diffracted lights generated from the illuminated X marks and diffracted lights generated from the illuminated Y marks, and to independently detect the diffracted lights by each diffraction order.

9. The measurement apparatus according to claim 5, wherein
the illumination system is configured to illuminate the X marks with a plurality of coherent beams with different wavelengths, and
the light-receiving system is configured to detect diffracted lights, which are generated from the illuminated X marks, for each of the different wavelengths,
the illumination system is configured to illuminate the Y marks with a plurality of coherent beams with different wavelengths, and
the light-receiving system is configured to detect diffracted lights, which are generated from the illuminated Y marks, for each of the different wavelengths.

10. A measurement apparatus that measures a plurality of X marks formed on a substrate and that are illuminated to thereby generate a beam from the illuminated X marks, and a plurality of Y marks formed on the substrate and that are illuminated to thereby generate a beam from the illuminated Y marks, the measurement apparatus comprising:
a computation unit which processes a signal obtained by receiving the beam generated from the illuminated X marks, and processes a signal obtained by receiving the beam generated from the illuminated Y marks; and
a control system including a control program and a system controller, execution of the control program by the system controller causing
measurement, via processing by the computation unit of the signal obtained by receiving the beam generated from the illuminated X marks, positions of all of the X marks under a first condition without measuring the Y marks,
measurement, via processing by the computation unit of the signal obtained by receiving the beam generated from the illuminated Y marks, positions of all of the Y marks in a second direction under a second condition without measuring the X marks, the X marks for measuring positions on the substrate in a first direction in a two-dimensional plane, and the Y marks for measuring positions on the substrate in a second direction orthogonal to the first direction in the two-dimensional plane, and switching a measurement condition from the first condition to the second condition after the measurement of all of the X marks under the first condition, wherein the first condition includes a signal processing condition to process, by the computation unit, the signal obtained by receiving the beam generated from the illuminated X marks, and the second condition includes a signal processing condition to process, by the computation unit, the signal obtained by receiving the beam generated from the illuminated Y marks.

11. An exposure apparatus that transfers a pattern formed on a mask onto a substrate, comprising:

the measurement apparatus according to claim 10; and a positioning device that positions the mask or the substrate based on a measurement result of the measurement apparatus.

12. The measurement apparatus according to claim 10, further comprising:

a retention apparatus configured to retain, for each of the first and second conditions, a baseline value, which is the interval between a reference position for measurements using the measurement apparatus and a reference position which specifies a position when performing desired processing of the substrate.

13. The measurement apparatus according to claim 10, wherein the signal processing condition to process the signal obtained by receiving the beam generated from the illuminated X marks includes at least one of:

a waveform analysis algorithm (a waveform processing algorithm) selected for processing a photoelectric converted signal, which is obtained by receiving the beam generated from the illuminated X marks, a signal processing algorithm including EGA calculation model, and a parameter selected for being used in the selected signal processing algorithm; and the signal processing condition to process the signal obtained by receiving the beam generated from the illuminated Y marks includes at least one of:

a waveform analysis algorithm (a waveform processing algorithm) selected for processing a photoelectric converted signal, which is obtained by receiving the beam generated from the illuminated Y marks, a signal processing algorithm including EGA calculation model, and a parameter selected for being used in the selected signal processing algorithm.

14. The measurement apparatus according to claim 13, wherein the measurement apparatus comprises:

an imaging optical system configured to form an image of the illuminated X marks and an image of the illuminated Y marks; and an image capture device configured to capture the image of the illuminated X marks and to output a corresponding capture signal, and to capture the image of the illuminated Y marks and to output a corresponding capture signal.

15. The measurement apparatus according to claim 13, wherein the measurement apparatus is configured to receive diffracted lights generated from the illuminated X marks and to make interference between same order diffracted lights among the diffracted lights generated from the illuminated X marks, and the measurement apparatus is configured to receive diffracted lights generated from the illuminated Y marks and to make interference between same order diffracted lights among the diffracted lights generated from the illuminated Y marks.

16. The measurement apparatus according to claim 13, wherein the measurement apparatus is configured to receive diffracted lights generated from the illuminated X marks and diffracted lights generated from the illuminated Y marks, and to independently detect the diffracted lights by each diffraction order.

17. The measurement apparatus according to claim 13, wherein the measurement apparatus is configured to illuminate the X marks with a plurality of coherent beams with different wavelengths, and to detect diffracted lights, which are generated from the illuminated X marks, for each of the different wavelengths; and the measurement apparatus is configured to illuminate the Y marks with a plurality of coherent beams with different wavelengths, and to detect diffracted lights, which are generated from the illuminated Y marks, for each of the different wavelengths.

18. A measurement apparatus that measures a plurality of X marks formed on a substrate and that are illuminated to thereby generate a beam from the illuminated X marks, and a plurality of Y marks formed on the substrate and that are illuminated to thereby generate a beam from the illuminated Y marks, the measurement apparatus comprising:

a computation unit which processes a signal obtained by receiving the beam generated from the illuminated X marks, and processes a signal obtained by receiving the beam generated from the illuminated Y marks;

a control system including a control program and a system controller, execution of the control program by the system controller causing measurement, via processing by the computation unit, the plurality of X marks without measuring Y marks, measurement, via processing by the computation unit, the plurality of Y marks without measuring X marks, the X marks each having line patterns that extend in a Y direction, the Y marks each having line patterns that extend in an X direction, the X direction being orthogonal to the Y direction, setting a measurement condition including a first condition and a second condition, the first condition being used when measuring all of the X marks without measuring the Y marks, the second condition being used when measuring all of the Y marks without measuring the X marks, switching the measurement condition from the first condition to the second condition after the measurement of all of the X marks on the substrate under the first condition, wherein the first condition includes a signal processing condition to process, by the computation unit, the signal obtained by receiving the beam generated from the illuminated X marks, and the second condition includes a signal processing condition to process, by the computation unit, the signal obtained by receiving the beam generated from the illuminated Y marks.

19. An exposure apparatus that transfers a pattern formed on a mask onto a substrate, comprising:

the measurement apparatus according to claim 18; and a positioning device that positions the mask or the substrate based on a measurement result of the measurement apparatus.

20. The measurement apparatus according to claim 18, further comprising:
a retention apparatus configured to retain, for each of the first and second conditions, a baseline value, which is the interval between a reference position for measurements using the measurement apparatus and a reference position which specifies a position when performing desired processing of the substrate.

21. The measurement apparatus according to claim 18, wherein
the signal processing condition to process the signal obtained by receiving the beam generated from the illuminated X marks includes at least one of:
a waveform analysis algorithm (a waveform processing algorithm) selected for processing a photoelectric converted signal, which is obtained by receiving the beam generated from the illuminated X marks,
a signal processing algorithm including EGA calculation model, and
a parameter selected for being used in the selected signal processing algorithm; and
the signal processing condition to process the signal obtained by receiving the beam generated from the illuminated Y marks includes at least one of:
a waveform analysis algorithm (a waveform processing algorithm) selected for processing a photoelectric converted signal, which is obtained by receiving the beam generated from the illuminated Y marks,
a signal processing algorithm including EGA calculation model, and
a parameter selected for being used in the selected signal processing algorithm.

22. The measurement apparatus according to claim 18, wherein the measurement apparatus comprises:
an imaging optical system configured to form an image of the illuminated X marks and an image of the illuminated Y marks; and
an image capture device configured to capture the image of the illuminated X marks and to output a corresponding capture signal, and to capture the image of the illuminated Y marks and to output a corresponding capture signal.

23. The measurement apparatus according to claim 18, wherein
the measurement apparatus is configured to receive diffracted lights generated from the illuminated X marks and to make interference between same order diffracted lights among the diffracted lights generated from the illuminated X marks, and
the measurement apparatus is configured to receive diffracted lights generated from the illuminated Y marks and to make interference between same order diffracted lights among the diffracted lights generated from the illuminated Y marks.

24. The measurement apparatus according to claim 18, wherein
the measurement apparatus is configured to receive diffracted lights generated from the illuminated X marks and diffracted lights generated from the illuminated Y marks, and to independently detect the diffracted lights by each diffraction order.

25. The measurement apparatus according to claim 18, wherein
the measurement apparatus is configured to illuminate the X marks with a plurality of coherent beams with different wavelengths, and to detect diffracted lights, which are generated from the illuminated X marks, for each of the different wavelengths; and
the measurement system is configured to illuminate the Y marks with a plurality of coherent beams with different wavelengths, and to detect diffracted lights, which are generated from the illuminated Y marks, for each of the different wavelengths.

* * * * *

UNITED STATES PATENT AND TRADEMARK OFFICE
CERTIFICATE OF CORRECTION

| | | |
|---|---|---|
| PATENT NO. | : 8,947,665 B2 | Page 1 of 1 |
| APPLICATION NO. | : 13/495284 | |
| DATED | : February 3, 2015 | |
| INVENTOR(S) | : Mitsuru Kobayashi et al. | |

It is certified that error appears in the above-identified patent and that said Letters Patent is hereby corrected as shown below:

References Cited

Second Page, Second Column, OTHER PUBLICATIONS, Line 7

Delete "corresponching" and insert --corresponding--, therefor.

Second Page, Second Column, OTHER PUBLICATIONS, Line 8

Delete "Appiication" and insert --Application--, therefor.

Second Page, Second Column, OTHER PUBLICATIONS, Line 9

Delete "maild" and insert --mailed--, therefor.

In the claims

Claim 6, Column 25, Line 66

Delete "am" and insert --an--, therefor.

Signed and Sealed this
Twenty-seventh Day of October, 2015

Michelle K. Lee
*Director of the United States Patent and Trademark Office*